US011317520B2

(12) United States Patent
Furuyama et al.

(10) Patent No.: US 11,317,520 B2
(45) Date of Patent: Apr. 26, 2022

(54) CIRCUIT BOARD, METHOD OF MANUFACTURING CIRCUIT BOARD, AND ELECTRONIC DEVICE

(71) Applicant: FUJITSU LIMITED, Kawasaki (JP)

(72) Inventors: Masaharu Furuyama, Fujisawa (JP); Daisuke Mizutani, Sagamihara (JP); Tomoyuki Akahoshi, Atsugi (JP); Masateru Koide, Kawasaki (JP); Manabu Watanabe, Yokohama (JP); Seigo Yamawaki, Nagano (JP); Kei Fukui, Iizuna (JP)

(73) Assignee: FUJITSU INTERCONNECT TECHNOLOGIES LIMITED, Nagano (JP)

( * ) Notice: Subject to any disclaimer, the term of this patent is extended or adjusted under 35 U.S.C. 154(b) by 341 days.

(21) Appl. No.: 16/162,470

(22) Filed: Oct. 17, 2018

(65) Prior Publication Data
US 2019/0053385 A1 Feb. 14, 2019

Related U.S. Application Data

(63) Continuation of application No. PCT/JP2016/062589, filed on Apr. 21, 2016.

(51) Int. Cl.
*H05K 3/46* (2006.01)
*H05K 3/42* (2006.01)
(Continued)

(52) U.S. Cl.
CPC .......... *H05K 3/4644* (2013.01); *H01G 4/228* (2013.01); *H01G 4/33* (2013.01);
(Continued)

(58) Field of Classification Search
CPC .... H05K 3/4644; H05K 1/0212; H05K 1/162; H05K 2201/095; H01G 4/228; H01G 4/33; H01L 23/49822; H01L 28/40
See application file for complete search history.

(56) References Cited

U.S. PATENT DOCUMENTS 8,144,480 B2 * 3/2012 Das .................. H05K 1/162
361/766
10,896,871 B2 * 1/2021 Akahoshi .......... H01L 23/49827
(Continued)

FOREIGN PATENT DOCUMENTS

JP  63-093198  4/1988
JP  02-022893  1/1990
(Continued)

OTHER PUBLICATIONS

Japanese Office Action dated Sep. 10, 2019 for corresponding Japanese Patent Application No. 2018-512713, with English Translation, 7 pages. *Please note JP-2005-310983-A and JP-2-22893-A cited herewith, were previously cited in an IDS filed on Oct. 17, 2018.*.

(Continued)

*Primary Examiner* — Minh N Trinh
(74) *Attorney, Agent, or Firm* — Westerman, Hattori, Daniels & Adrian, LLP

(57) ABSTRACT

A circuit board includes: an insulating layer; a capacitor which is provided in the insulating layer and which includes a dielectric layer, a first conductor layer provided on a first surface of the dielectric layer and including an opening part, and a second conductor layer provided on a second surface opposite to the first surface of the dielectric layer and including a recess part at a position corresponding to the opening part; and a conductor via provided in the insulating layer, penetrating the dielectric layer, the opening part and the recess part, being in contact with the recess part, and being smaller than the opening part in plan view.

8 Claims, 16 Drawing Sheets

(51) Int. Cl.
- *H05K 1/02* (2006.01)
- *H01G 4/228* (2006.01)
- *H01G 4/33* (2006.01)
- *H01L 23/498* (2006.01)
- *H01L 49/02* (2006.01)
- *H05K 1/16* (2006.01)

(52) U.S. Cl.
CPC ........ *H01L 23/49822* (2013.01); *H01L 28/40* (2013.01); *H05K 1/0212* (2013.01); *H05K 1/162* (2013.01); *H05K 3/429* (2013.01); *H05K 3/46* (2013.01); *H01L 2224/16225* (2013.01); *H01L 2924/15311* (2013.01); *H05K 2201/095* (2013.01)

(56) References Cited

U.S. PATENT DOCUMENTS

| | | | | |
|---|---|---|---|---|
| 2006/0245139 | A1* | 11/2006 | Kariya | H01G 4/232 361/272 |
| 2009/0175011 | A1* | 7/2009 | Kariya | H05K 1/162 361/761 |
| 2009/0273884 | A1 | 11/2009 | Shimizu et al. | |
| 2010/0060381 | A1* | 3/2010 | Das | H05K 1/0234 333/172 |
| 2012/0307469 | A1* | 12/2012 | Oka | H01L 23/49805 361/782 |
| 2019/0053385 | A1* | 2/2019 | Furuyama | H05K 3/4644 |

FOREIGN PATENT DOCUMENTS

| | | |
|---|---|---|
| JP | 2005-166940 | 6/2005 |
| JP | 2005-310983 | 11/2005 |
| JP | 2006-210776 | 8/2006 |
| JP | 2009-224699 | 10/2009 |
| JP | 2009-267310 | 11/2009 |
| JP | 2015-18988 | 1/2015 |

OTHER PUBLICATIONS

International Search Report and Written Opinion of the International Searching Authority, mailed in connection with PCT/JP2016/062589 dated Jun. 7, 2016 (14 pages), with partial English translation.

* cited by examiner

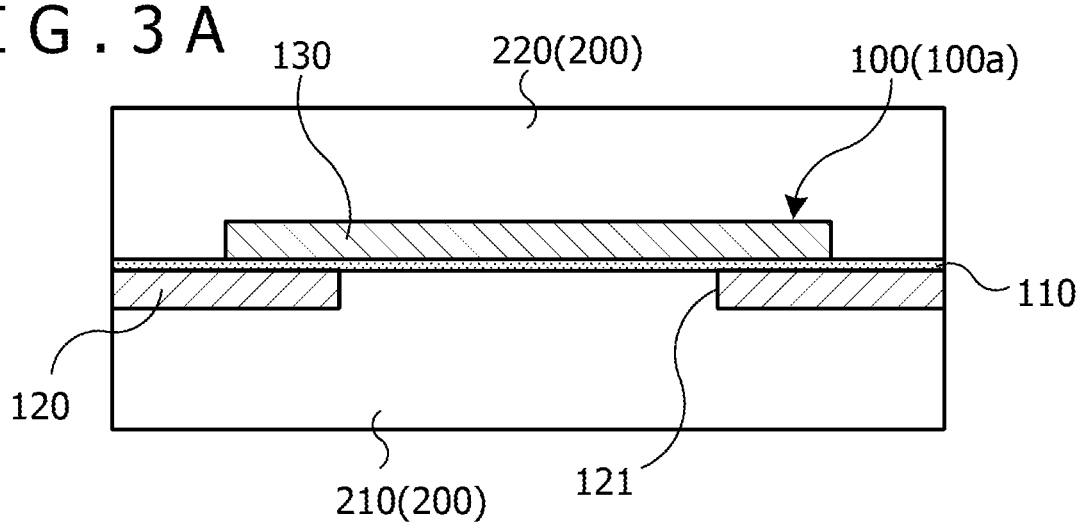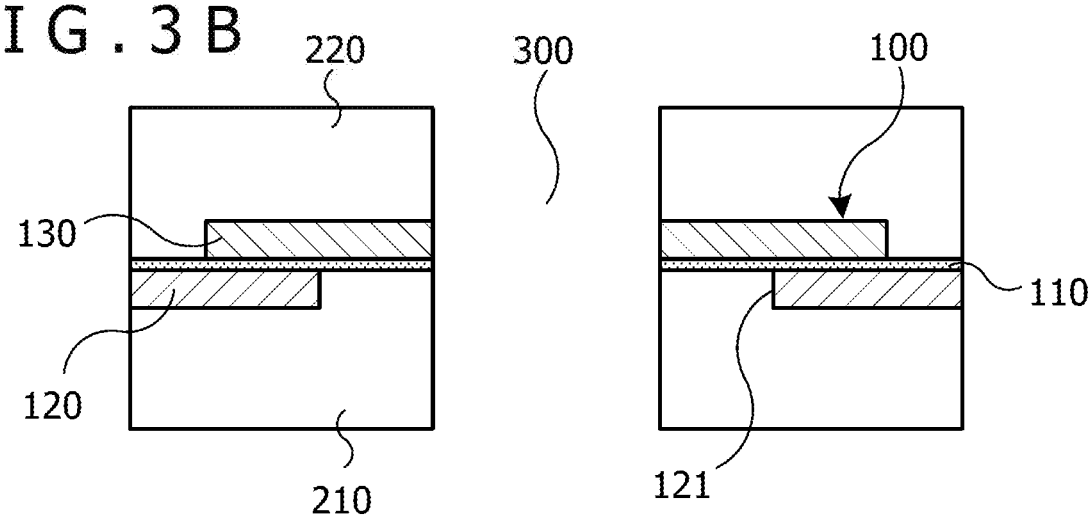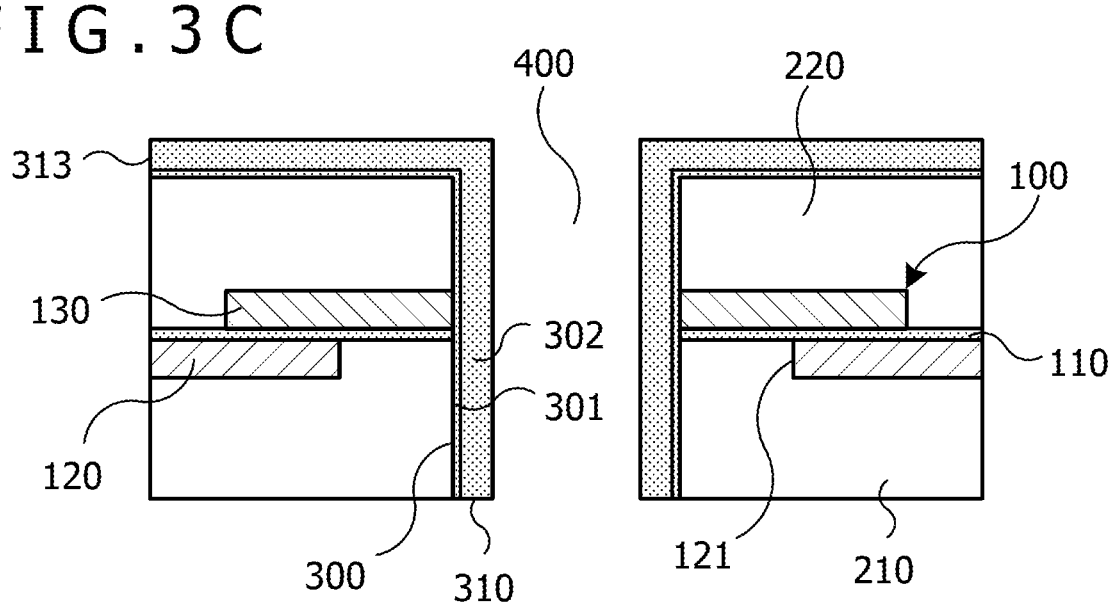

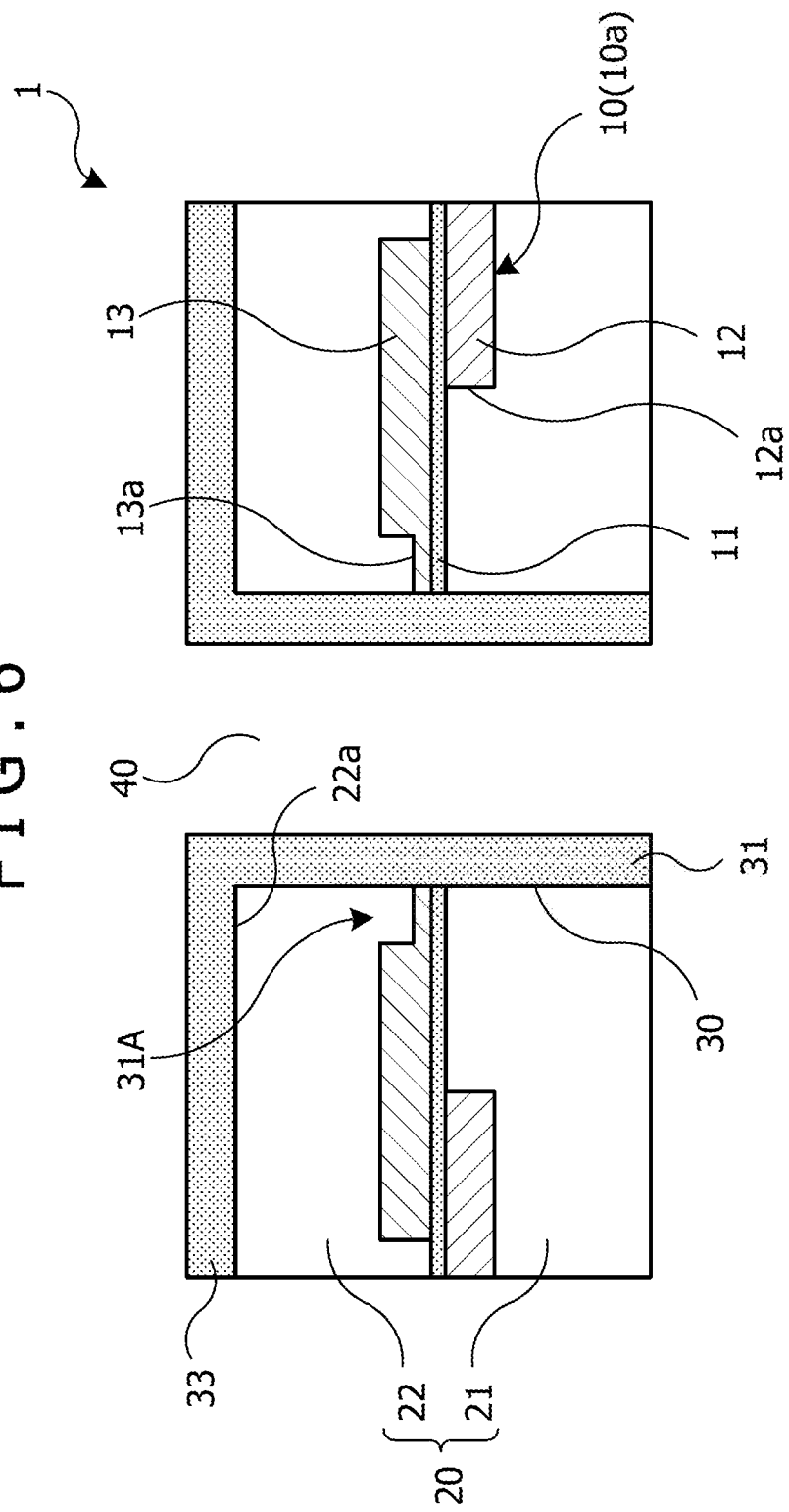

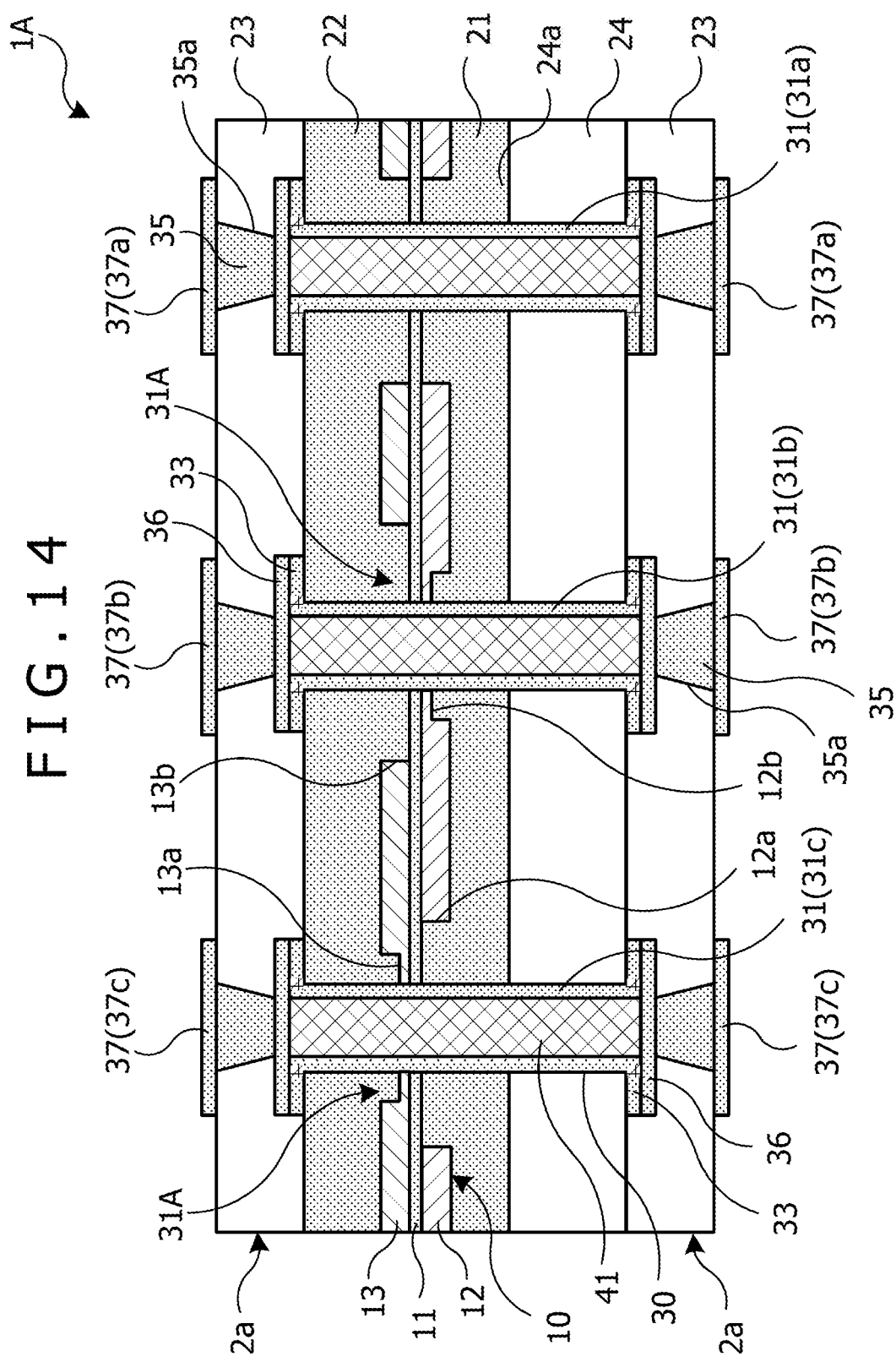

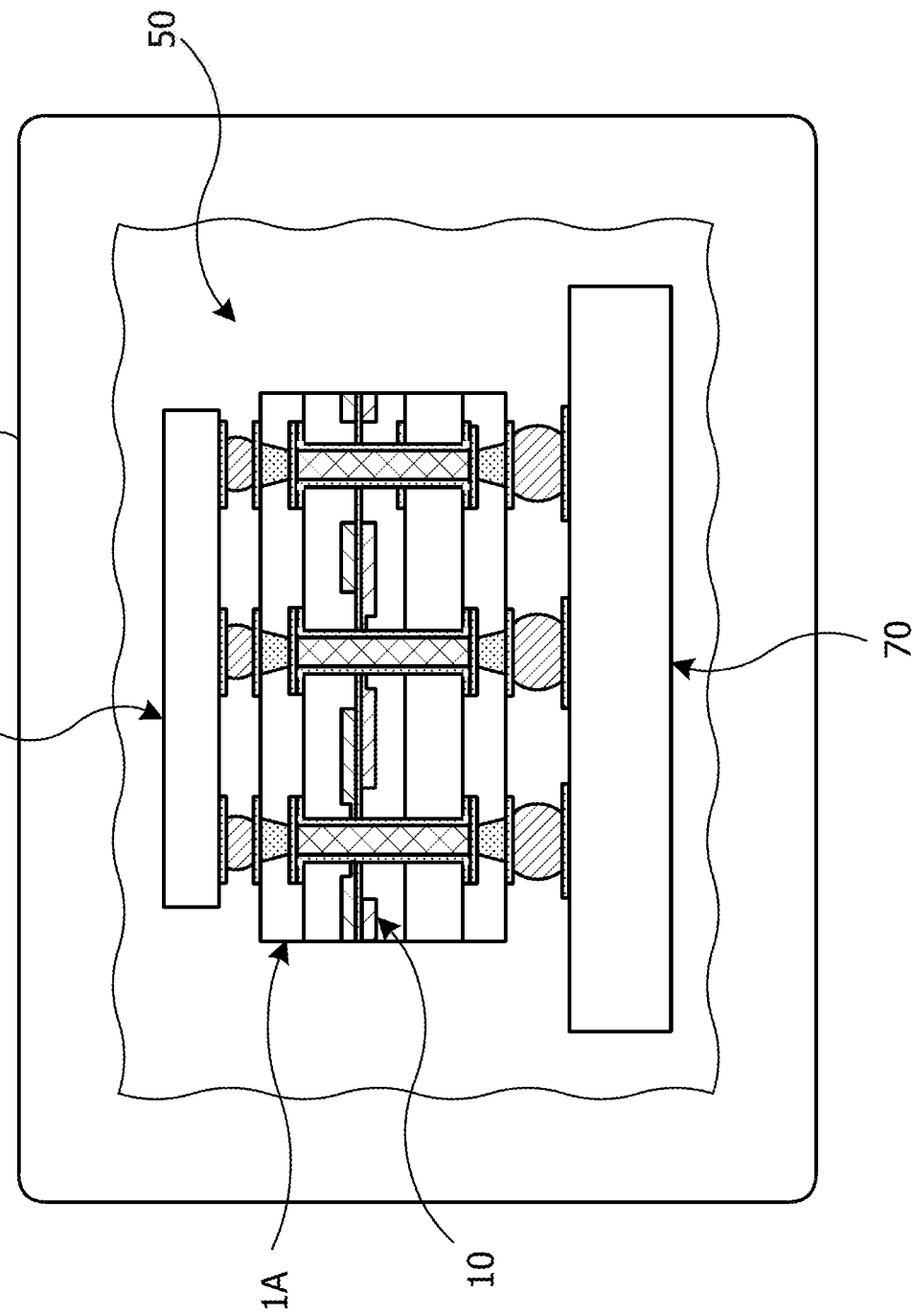

CIRCUIT BOARD, METHOD OF MANUFACTURING CIRCUIT BOARD, AND ELECTRONIC DEVICE

CROSS-REFERENCE TO RELATED APPLICATIONS

This application is a continuation application of International Application PCT/JP2016/062589 filed on Apr. 21, 2016 and designated the U.S., the entire contents of which are incorporated herein by reference.

FIELD

The embodiments discussed herein are related to a circuit board, a method of manufacturing a circuit board, and an electronic device.

BACKGROUND

There has been a technology in which a capacitor is incorporated in a circuit board. A capacitor has a structure in which a dielectric layer using a given material is sandwiched between a pair of conductor layers. In relation to the circuit board incorporating the capacitor, there has been a technology in which, for interlayer coupling inside the circuit board, a conductor via is provided which penetrates the capacitor while making contact with the dielectric layer and one of the pair of conductor layers sandwiching the dielectric layer therebetween. In addition, there has been also a technology in which a conductor via is provided which penetrates the capacitor in a non-contact relation with the dielectric layer and at least one of the pair of conductor layers sandwiching the dielectric layer therebetween. The conductor via is provided in the circuit board by forming a hole penetrating a given part of the capacitor and forming a conductor via material in the hole.

Examples of related-art documents are Japanese Laid-open Patent Publication No. 2006-210776 and Japanese Laid-open Patent Publication No. 2015-18988.

SUMMARY

According to an aspect of the embodiments, a circuit board includes an insulating layer; a capacitor which is provided in the insulating layer and which includes a dielectric layer, a first conductor layer provided on a first surface of the dielectric layer and including an opening part, and a second conductor layer provided on a second surface opposite to the first surface of the dielectric layer and including a recess part at a position corresponding to the opening part; and a conductor via provided in the insulating layer, penetrating the dielectric layer, the opening part and the recess part, being in contact with the recess part, and being smaller than the opening part in plan view.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 3A, 3B and 3C are figures illustrating an example of a method of forming a circuit board;

FIG. 6 is a figure illustrating an example of a circuit board according to a first embodiment;

FIG. 14 is a figure illustrating an example of a circuit board according to a second embodiment;

FIG. 16 is a figure illustrating an example of an electronic apparatus according to the third embodiment.

DESCRIPTION OF EMBODIMENTS

In recent years, in semiconductor devices such as semiconductor chips and semiconductor packages to be mounted on electronic devices and electronic apparatuses, increases in performance, operation speed and current and a decrease in voltage have been under way. For stable operation of such a semiconductor device, it is important to reduce variations in power supply voltage and to remove high-frequency noises. Therefore, with respect to a circuit board on which to mount a semiconductor device, a reduction in power supply impedance is advantageous.

As one technique for reducing the power supply impedance, there has been known a technique of mounting a chip capacitor on the circuit board, and coupling the chip capacitor between a power supply line and a ground (GND) line of the circuit board. From the viewpoint of shortening the wiring length from the semiconductor device to the capacitor and suppressing an inductance component of the wiring, there has been known a technique of incorporating a chip capacitor in a circuit board and a technique of incorporating a capacitor (thin film capacitor) formed by a dielectric layer and a pair of conductor layers sandwiching the dielectric layer therebetween.

A circuit board incorporating a capacitor will be described. The circuit board incorporating a capacitor includes a capacitor including a structure in which a dielectric layer is sandwiched between a pair of conductor layers, in an insulating layer. One of the pairs of conductor layers is set to a power supply potential, while the other is set to a GND potential, and both are electrically coupled to a power supply terminal and a GND terminal for external coupling of the circuit board.

In the circuit board incorporating a capacitor, a conductor via which penetrates a capacitor provided in an insulating layer may be provided for interlayer coupling inside the circuit board. The circuit board including such a conductor via is formed, for example, a method as follows.

FIGS. 1A to 3C are figures illustrating an example of a method of forming a circuit board. In FIGS. 1A to 1C, FIGS. 2A to 2C and FIGS. 3A to 3C, a section of a major part in each process in forming the circuit board is illustrated schematically.

Figure 1A:
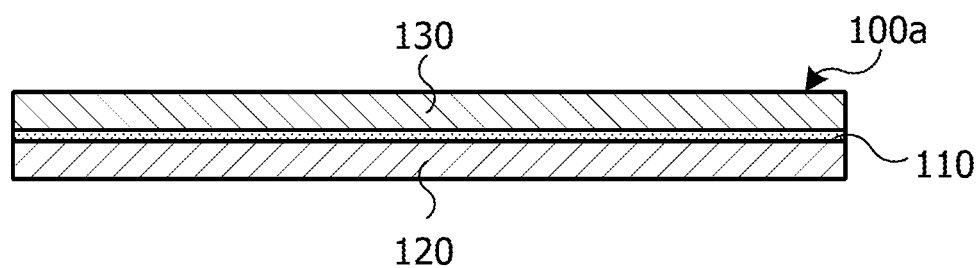
FIGS. 1A, 1B, and 1C are figures illustrating an example of a method of forming a circuit board.

First, a capacitor board 100a in which a dielectric layer 110 is sandwiched between a pair of a conductor layers (electrode layers) 120 and 130 as illustrated in FIG. 1A is prepared. The capacitor board 100a is obtained, for example, by forming the dielectric layer 110 on the electrode layer 130 on one side and forming thereon the electrode layer 120 on the other side. Various dielectric materials may be used for the dielectric layer 110, and various conductor materials may be used for the electrode layer 120 and the electrode layer 130. A ceramic material such as barium titanate ($BaTiO_3$; BTO) is used for the dielectric layer 110, and a metallic material such as copper (Cu) or nickel (Ni) is used for the electrode layer 120 and the electrode layer 130.

Figure 1B:
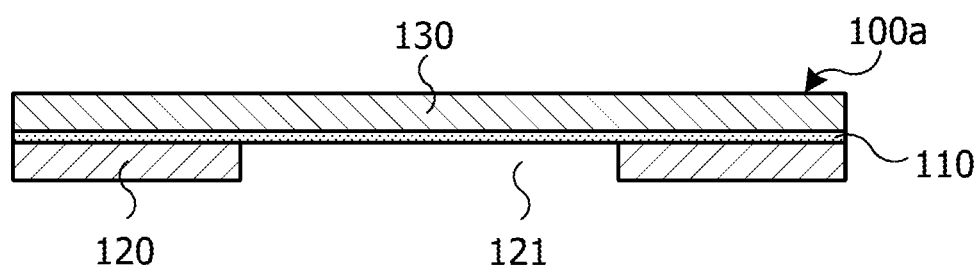

Next, the electrode layer 120 on one side of the capacitor board 100a is patterned into respective given shapes. The patterning of the electrode layer 120 is performed, for example, by etching. FIG. 1B illustrates an example in which the electrode layer 120 is formed with an opening part 121 in a region including a position where a conductor via 310 (or a hole 300 for forming thereof) is to be formed. The conductor via 310 is described later.

Figure 1C:
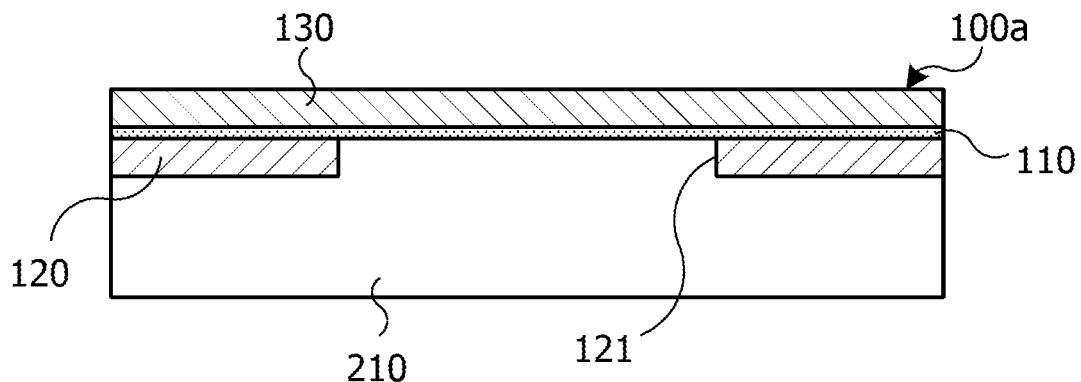

The capacitor board 100a having the electrode layer 120 patterned is united with an insulating layer 210, as illustrated in FIG. 1C. The insulating layer 210 is made of a resin, a prepreg or the like, which is provided on a base board including one or a plurality of wiring layers, for example. The insulating layer 210 may use an epoxy resin or the like. Onto such an insulating layer 210, the capacitor board 100a is bonded under heating and pressurizing (thermocompression bonded), with its patterned electrode layer 120 side facing the insulating layer 210, whereby the capacitor board 100a is united with the insulating layer 210.

Figure 2A:
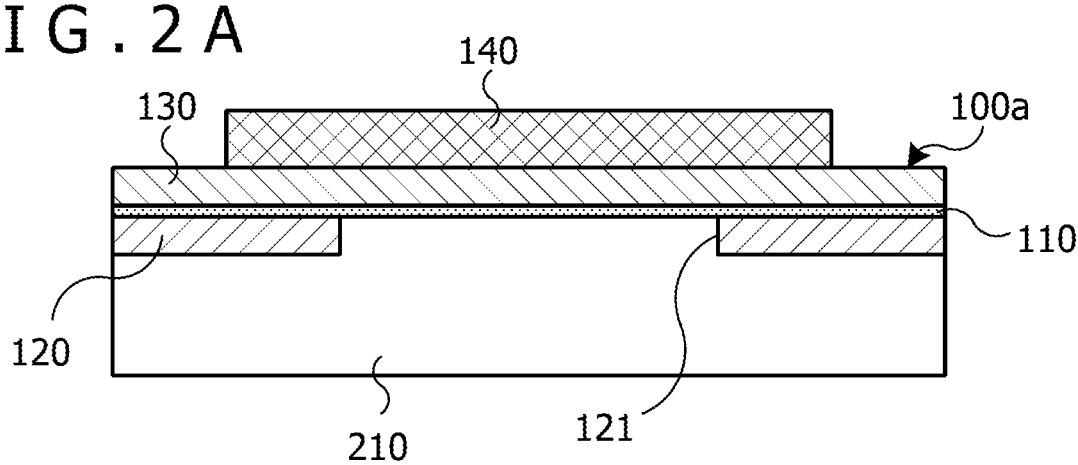
FIGS. 2A, 2B and 2C are figures illustrating an example of a method of forming a circuit board.
Figure 2B:
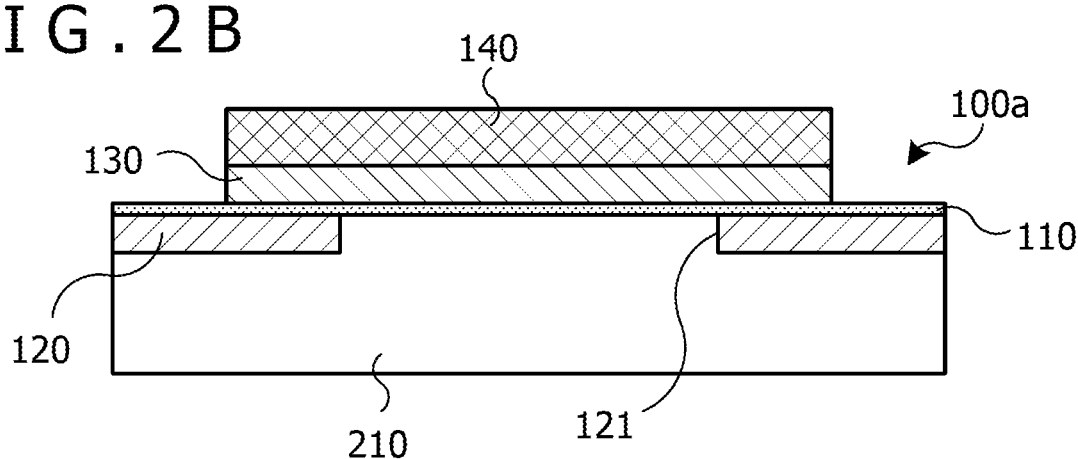
Figure 2C:
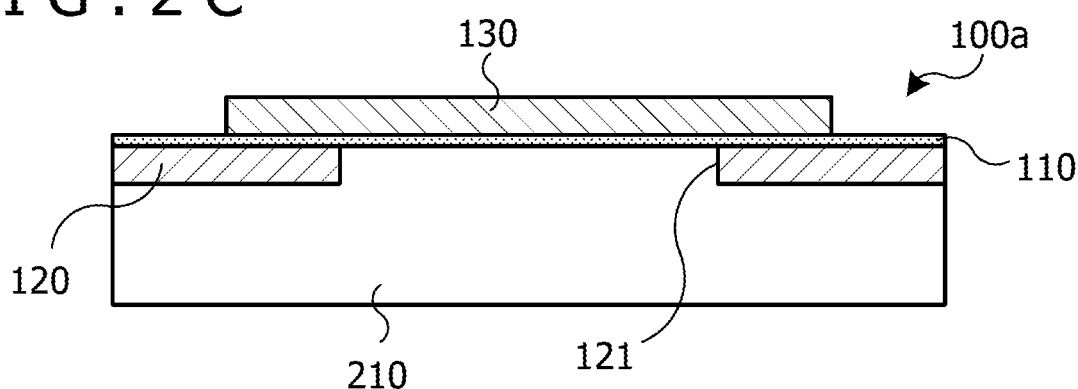

The capacitor board 100a united with the insulating layer 210 has the electrode layer 130 on another side patterned into a given shape. The patterning of the electrode layer 130 is carried out, for example, by etching. In this case, first, a resist pattern 140 in a given shape is formed on the electrode layer 130, as depicted in FIG. 2A. Next, etching of the electrode layer 130 is conducted with the formed resist pattern 140 as a mask, as illustrated in FIG. 2B, whereby the electrode layer 130 is patterned into a given planar shape. After the etching, the resist pattern 140 is removed, as depicted in FIG. 2C. The electrode layer 130 is patterned in such a manner as to be provided at a position corresponding to the electrode layer 120 and the opening part 121 thereof.

After the patterning of the electrode layer 130, an insulating layer 220 is formed on the capacitor board 100a as illustrated in FIG. 3A. The insulating layer 210 is made of a resin, a prepreg or the like, which is provided on a base board including one or a plurality of wiring layers, for example. The insulating layer 210 may use an epoxy resin or the like. Such an insulating layer 220 is thermocompression bonded onto the capacitor board 100a on the insulating layer 210. This results in that the capacitor board 100a united with the insulating layer 210 is covered by the insulating layer 220.

With the process described above, a basic structure of a circuit board is formed in which the capacitor 100 (capacitor board 100a) is incorporated in the insulating layer 210 and the insulating layer 220 (insulating layer 200). In the case of providing the circuit board with a conductor via penetrating the incorporated capacitor 100, for interlayer coupling inside the circuit board, a hole 300 penetrating the capacitor 100 is first formed, as illustrated in FIG. 3B. The hole 300 may be formed by laser processing or drilling. The hole 300 is formed in such a manner as, for example, to penetrate the circuit board or to reach a part of a wiring layer provided on the base board on the insulating layer 210 side.

The hole 300 is formed at the position of the opening part 121 of the electrode layer 120, in an opening size smaller than that of the opening part 121 (in a size smaller than the opening part 121 in plan view). For example, at the time of patterning (FIG. 1B) of the electrode layer 120, the opening part 121 is larger in opening size than the hole 300 formed. Of the dielectric layer 110, the electrode layer 120 and the electrode layer 130 of the capacitor 100, the dielectric layer 110 and the electrode layer 130 on one side are exposed at an inner wall of the hole 300, as illustrated in FIG. 3B.

After the formation of the hole 300, a conductor material is formed on the inner wall of the hole 300, and the conductor via 310 is formed, as illustrated in FIG. 3C. Various conductor materials, for example, a metallic material such as Cu, may be used for the conductor via 310. The conductor via 310 is obtained, for example, by first forming a conductor layer (seed layer) 301 by electroless plating, and then forming a conductor layer (plating layer) 302 by electroplating using the seed layer 301 as a current supplying layer.

When the conductor via 310 is formed on the inner wall of the hole 300, the seed layer 301 and the plating layer 302 are formed also on an upper surface of the insulating layer 220. The seed layer 301 and the plating layer 302 formed on the upper surface of the insulating layer 220 are used as part (conductor layer 313) of wiring coupled to the conductor via 310, of the circuit board.

As illustrated in FIG. 3C, the conductor via 310 provided on the inner wall of the hole 300 makes contact with the dielectric layer 110 and the electrode layer 130 of the capacitor 100 which are exposed at the inner wall at the time of formation of the hole 300. This results in that the conductor via 310 penetrating the capacitor 100 and the electrode layer 130 of the capacitor 100 are electrically coupled. The conductor via 310 and the electrode layer 130 of the capacitor 100 thus coupled are set to a power supply potential or a GND potential. Of the capacitor 100, the electrode layer 120 on another side which is provided with the opening part 121 and is not coupled to the conductor via 310 is set to a potential different from that of the electrode layer 130 coupled to the conductor via 310. By the conductor via 310, an interlayer coupling structure for electrically coupling a plurality of layers inclusive of the capacitor 100, in the circuit board, is formed.

As illustrated in FIG. 3C, for example, in a central area of the hole 300 formed with the conductor via 310 on the inner wall thereof, a cavity 400 is left, after the formation of the conductor via 310. The cavity 400 may be filled with a resin (not illustrated) such as an epoxy resin. While a conformal via formed on the inner wall of the hole 300 is illustrated here as an example of the conductor via 310, a filled via in which the hole 300 is filled with a conductor material may be formed.

While illustration is omitted, a so-called build-up process may be carried out in which an insulating layer of a resin or the like is laminated on the insulating layer 220 side and the insulating layer is formed with a conductor via and a conductor layer, after the process of FIG. 3C. Such a build-up process is conducted one time or repeated multiple times, whereby a circuit board including a desired number of wiring layers is obtained.

Other than the above, a so-called collective lamination process of laminating one or a plurality of boards including an insulating layer of a resin or the like and a conductor layer patternedly formed thereon on the capacitor 100 side may, for example, be conducted after the process of FIG. 3A, thereby obtaining a circuit board including a desired number of wiring layers. In this case, after the collective lamination process, the formation of the hole 300 is conducted as illustrated in FIG. 3B, and the formation of the conductor via 310 is performed as illustrated in FIG. 3C.

The method as above, for example, is used to form the conductor via 310 penetrating the capacitor 100, and an interlayer coupling structure of the circuit board by the conductor via 310 is realized. As another method of obtaining an interlayer coupling structure of a circuit board, there is a so-called multi-stage laser processing method in which each layer laminated is subjected respectively to formation of a hole by laser processing and formation of a conductor material in the hole, whereby a conductor via for electrically coupling the layers is formed.

When the method of collectively forming the hole 300 in the plurality of layers (FIG. 3B) and forming the conductor via 310 in the hole 300 (FIG. 3C) as above is used, simplification of the circuit board formation and enhancement of the efficiency thereof may be realized, as compared to the case where the multi-stage laser processing method is used. When the formation of the hole 300 is conducted by drilling, the hole 300 may be formed in a given opening diameter and in a desired depth, and enhancement of the degree of freedom in design in multilayer formation of a circuit board may be realized.

Figure 4A:
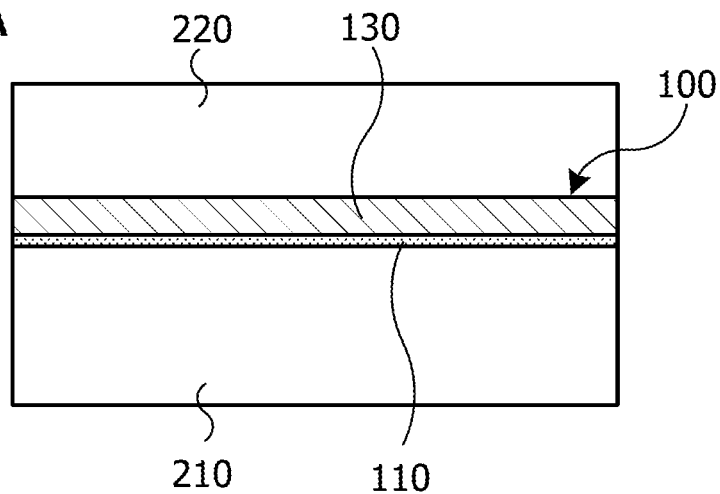
FIGS. 4A, 4B and 4C are illustrations of a hole forming process in forming a circuit board.
Figure 4B:
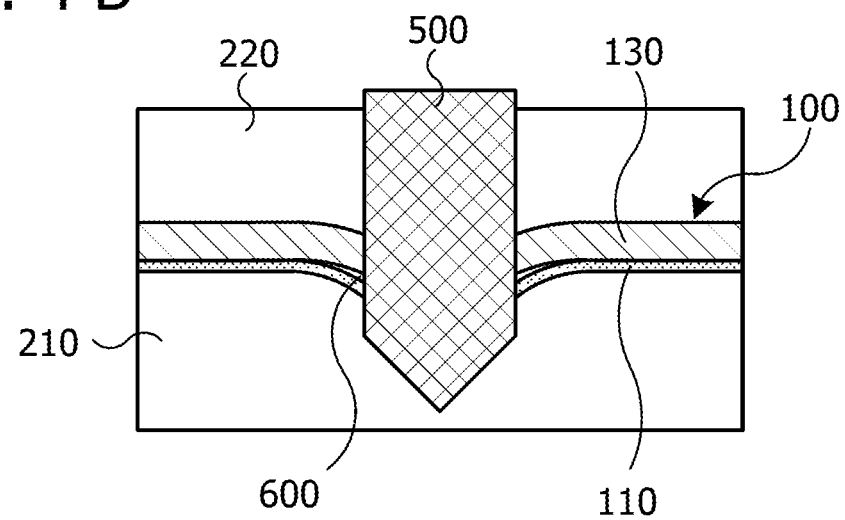
Figure 4C:
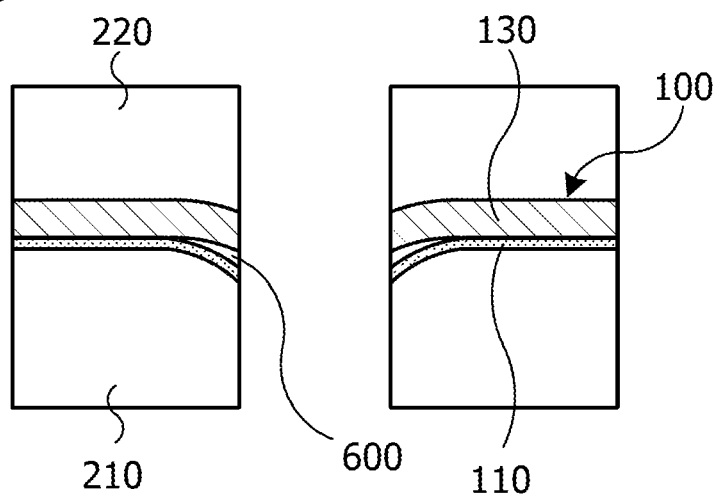
Figure 5A:
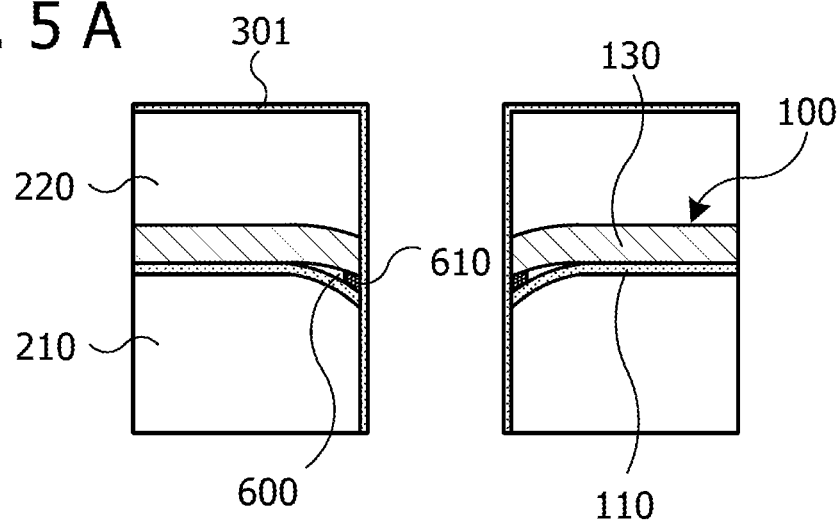
FIGS. 5A, 5B and 5C are illustrations of a conductor via forming process and a heating process in forming a circuit board.
Figure 5B:
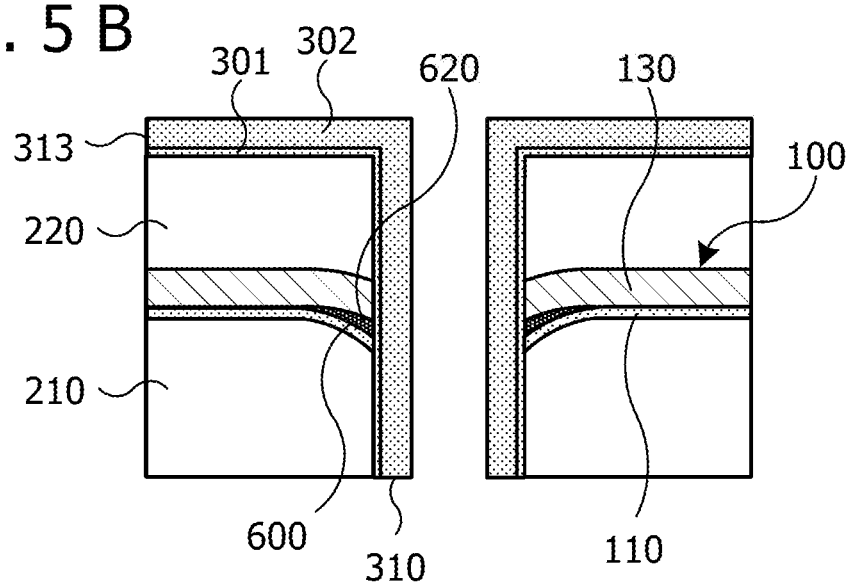
Figure 5C:
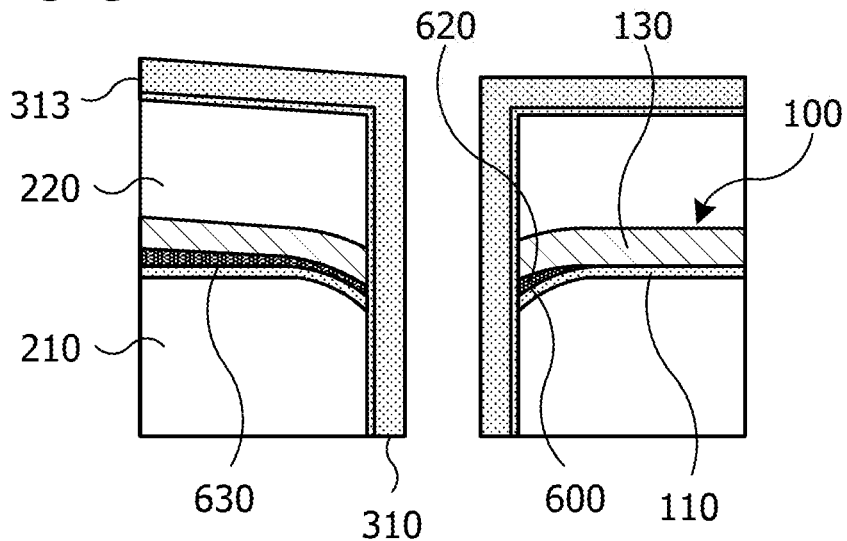

On the other hand, in the method of forming the hole 300 by drilling, situations as illustrated in FIGS. 4A, 4B and 4C and FIGS. 5A, 5B and 5C may occur. FIGS. 4A, 4B and 4C are illustrations of a hole forming process in forming a circuit board, and FIGS. 5A, 5B and 5C are illustrations of a conductor via forming process and a heating process in forming a circuit board. FIG. 4A illustrates schematically a section of a major part before hole formation, FIG. 4B illustrates schematically a section of a major part during the hole formation, and FIG. 4C illustrates schematically a section of a major part after the hole formation. FIG. 5A illustrates schematically a section of a major part in an electroless plating process, FIG. 5B illustrates schematically a section of a major part in an electroplating process, and FIG. 5C illustrates schematically a section of a major part in a heating process.

As illustrated in FIG. 4A, for forming a laminate (FIG. 3A) of the insulating layer 210, the capacitor 100 and the insulating layer 220 with the hole 300 for the conductor via 310, hole formation by use of a drill 500 as depicted in FIG. 4B is conducted. The hole formation by use of the drill 500 is carried out, for example, from the insulating layer 220 side, in such a manner that the hole formed penetrates the insulating layer 220, the electrode layer 130 and the dielectric layer 110 of the capacitor 100, and the insulating layer 210. The hole formation is conducted at the position of the opening part 121 formed in the electrode layer 120 of the capacitor 100, as illustrated in FIG. 3B. In FIGS. 4A, 4B and 4C and FIGS. 5A, 5B and 5C, the electrode layer 120 is not illustrated (the opening part 121 thereof is illustrated). At the inner wall of the hole 300 formed by the drill 500, there are exposed the insulating layer 220, the electrode layer 130, the dielectric layer 110 and the insulating layer 210, as illustrated in FIG. 4B.

When the hole formation is thus conducted using the drill 500, stress at the time of the processing deforms the electrode layer 130, and the dielectric layer 110 is deformed attendant on the deformation of the electrode layer 130, as illustrated in FIGS. 4B and 4C. Due to such deformations of the electrode layer 130 and the dielectric layer 110 and, further, to differences in physical properties of the layers, adhesion properties and the like, a crack 600 as depicted in FIGS. 4B and 4C may be generated between the electrode layer 130 and the dielectric layer 110.

When electroless plating is performed in a state in which such a crack 600 has been generated, as illustrated in FIG. 5A, the crack 600 may be left without being filled with a plating solution 610 of the electroless plating or with the seed layer 301 formed. When electroplating is further conducted as depicted in FIG. 5B after the electroless plating, a plating solution 620 may enter into the crack 600. Alternatively, the crack 600 may remain as void even after the electroplating. The plating solution 620 having entered into the crack 600 or the void remaining in the crack 600 may be enclosed in the crack 600 through a process in which the inner wall of the hole 300 is closed with the seed layer 301 formed by the electroless plating and the plating layer 302 formed by the electroplating, for example, the conductor via 310.

When the circuit board after the formation of the conductor via 310 is heated due to application of heat at the time of a test or in practical use in a state in which the plating solution 620 or the void is left in the crack 600, the plating solution 620 or the void (a gas inside thereof) remaining in the crack 600 may expand. When the plating solution 620 or the void in the crack 600 thus expands due to heating, as illustrated in FIG. 5C, exfoliation 630 may be generated between the electrode layer 130 and the dielectric layer 110 of the capacitor 100, with the crack 600 at the inner wall of the hole 300 as a starting point. The exfoliation 630 generated between the electrode layer 130 and the dielectric layer 110 would cause a lowering in capacitance of the capacitor 100.

Thus, when the method of forming the hole 300 by drilling is used, the crack 600 generated between the electrode layer 130 and the dielectric layer 110 and the exfoliation 630 arising therefrom may lower the reliability and performance of the capacitor 100 and the circuit board incorporating the capacitor 100.

A case in which drilling is applied to a laminated part of the electrode layer 130 and the dielectric layer 110 present at a position corresponding to the opening part 121 of the electrode layer 120 has been described here as an example. The same as above applies also to a case in which drilling is applied to a laminated part of the dielectric layer 110 and the electrode layer 120 present at a position corresponding to the opening part of the electrode layer 130. In this case, also, the crack and exfoliation generated between the dielectric layer 110 and the electrode layer 120 due to the drilling may cause a lowering in the reliability and performance of the capacitor 100 and the circuit board incorporating the capacitor 100.

Taking the above-mentioned points into consideration, the lowering in the reliability and performance of the circuit board incorporating the capacitor is reduced by use of techniques as described as embodiments below. First, a first embodiment will be described.

FIG. 6 is a figure illustrating an example of a circuit board according to the first embodiment. FIG. 6 illustrates schematically a section of a major part of the circuit board according to the first embodiment. A circuit board 1 illustrated in FIG. 6 includes an insulating layer 20 (an insulating layer 21 and an insulating layer 22), and a capacitor 10 (capacitor board 10a) provided in the insulating layer 20. The circuit board 1 further includes a conductor via 31 provided in a hole 30 penetrating the insulating layer 20 and the capacitor 10, and a conductor layer 33 coupled to the conductor via 31.

The capacitor 10 includes a dielectric layer 11, and a pair of a conductor layers (electrode layers) 12 and 13 sandwiching the dielectric layer 11 therebetween. Various dielectric materials may be used for the dielectric layer 11. For example, a ceramic material is used for the dielectric layer 11. As the ceramic material for the dielectric layer 11, various high dielectric materials such as BTO may be used. As the ceramic material for the dielectric layer 11, there may be used high dielectric materials such as barium strontium titanate ($Ba_xSr_{1-x}TiO_3$; BSTO) obtained by addition of strontium (Sr) to BTO, strontium titanate ($SrTiO_3$; STO), lead zirconate titanate ($Pb(Zr,Ti)O_3$; PZT), and lanthanum-added PZT (PLZT). The thickness of the dielectric layer 11 is, for example, 1 to 3 μm.

For the electrode layer 12 and the electrode layer 13, various conductor materials may be used. For example, a metallic material or materials are used for the electrode layer 12 and the electrode layer 13. As the metallic material for the electrode layer 12, there may be used Cu, Ni and the like. The thicknesses of the electrode layer 12 and the electrode layer 13 are, for example, 15 to 30 μm. The electrode layer 12 and the electrode layer 13 are respectively patterned into given shapes. The electrode layer 12 includes an opening part 12a in a region including the position at which to form the conductor via 31 or the hole 30. The electrode layer 13 includes a recess part 13a, which is a thinned part, at an outer peripheral part 31A of the conductor via 31 or the hole 30. The electrode layer 12 and the electrode layer 13 are provided respectively with the opening part 12a and the recess part 13a at positions corresponding to each other.

Such a capacitor 10 is provided in the insulating layer 20. The insulating layer 21, as that part of the insulating layer 20 which is provided beneath the capacitor 10, is, for example, an insulating layer of a resin, a prepreg or the like, which is provided on a base board including one or a plurality of wiring layers. For the insulating layer 21, there may be used resin materials such as epoxy resin, polyimide resin, and bismaleimide-triazine resin, or such a resin material in which glass or other fibers or cloth is contained. For the insulating layer 22, as that part of the insulating layer 20 which is provided on the capacitor 10, also, there may be used resin materials such as epoxy resin, polyimide resin, and bismaleimide-triazine resin, or such a resin in which glass or other fibers or cloth is contained.

The hole 30 is formed in such a manner as to penetrate the insulating layer 22, the capacitor 10 and the insulating layer 21. The hole 30 is formed by drilling, as will be described later. For example, a hole 30 which has a circular planar shape and has an opening size of 50 to 300 μm in diameter is provided. The hole 30 is formed at the position of the opening part 12a of the electrode layer 12 and the recess part 13a of the electrode layer 13 in contact with the recess part 13a with an opening size smaller than that of the opening part 12a (in a size smaller than the opening part 12a in plan view). The dielectric layer 11 and the electrode layer 13, out of the dielectric layer 11 and the electrode layer 12 and the electrode layer 13 of the capacitor 10, are exposed at the inner wall of the hole 30. The exposed part of the electrode layer 13 includes the recess part 13a which is a thinned part.

The conductor via 31 is provided in the hole 30. For the conductor via 31, various conductor materials may be used. For example, a metallic material is used for the conductor via 31. As the metallic material for the conductor via 31, there may be used Cu and the like. The conductor via 31 is formed by use of a plating method, as will be described later. The conductor via 31 is, for example, a conformal via which is provided on the inner wall of the hole 30, with the cavity 40 left in a central area. The cavity 40 may be filled with a resin (not illustrated).

The conductor layer 33 coupled to the conductor via 31 provided in the hole 30 is provided on the upper surface 22a of the insulating layer 22. For the conductor layer 33, various conductor materials may be used. For example, a metallic material is used for the conductor layer 33. As the metallic material for the conductor layer 33, there may be used Cu and the like. The conductor layer 33 is formed, for example, simultaneously with the conductor via 31 when the conductor via 31 is formed on the inner wall of the hole 30 by use of a plating method, as will be described later.

In the circuit board 1, the conductor via 31 penetrates, while making contact with, the recess part 13a of the electrode layer 13 of the capacitor 10 and the dielectric layer 11, and penetrates, without contacting, the opening part 12a of the electrode layer 12. The conductor via 31 (and the conductor layer 33 coupled thereto) is electrically coupled to the electrode layer 13 of the capacitor 10.

At the time of forming the circuit board 1, the electrode layer 12 is preliminarily provided with the opening part 12a larger than the hole 30 for forming the conductor via 31, and the electrode layer 13 is preliminarily provided with the recess part 13a at the position at which to form the hole 30 for forming the conductor via 31. Then, in a condition in which the capacitor 10 including such an electrode layer 12 and such an electrode layer 13 is provided between the insulating layer 21 and the insulating layer 22, the hole 30 is formed in such a manner as to penetrate the opening part 12a and the recess part 13a by drilling.

Figure 7A:
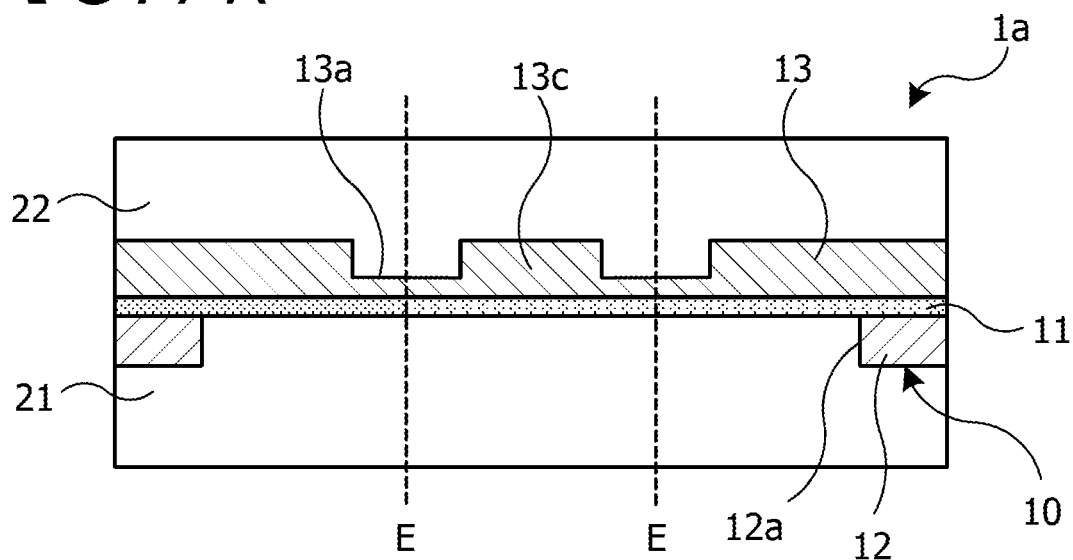
FIGS. 7A and 7B are illustrations of an example of drilling according to the first embodiment.
Figure 7B:
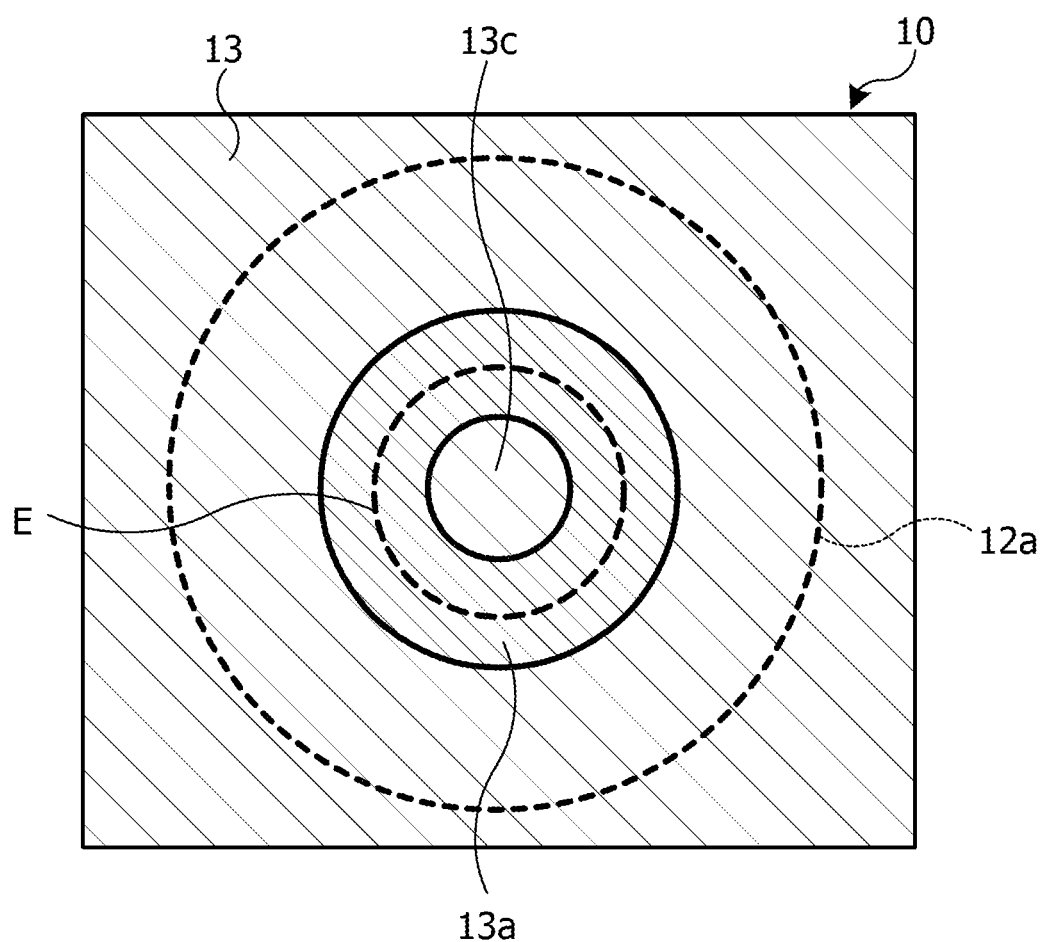
Figure 8A:
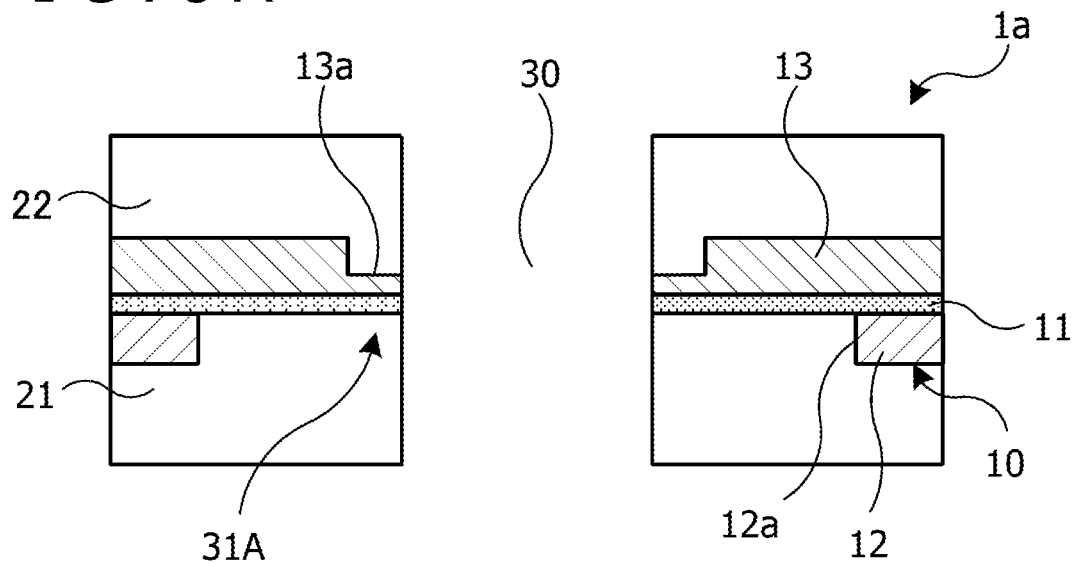
FIGS. 8A and 8B are illustrations of an example of drilling according to the first embodiment.
Figure 8B:
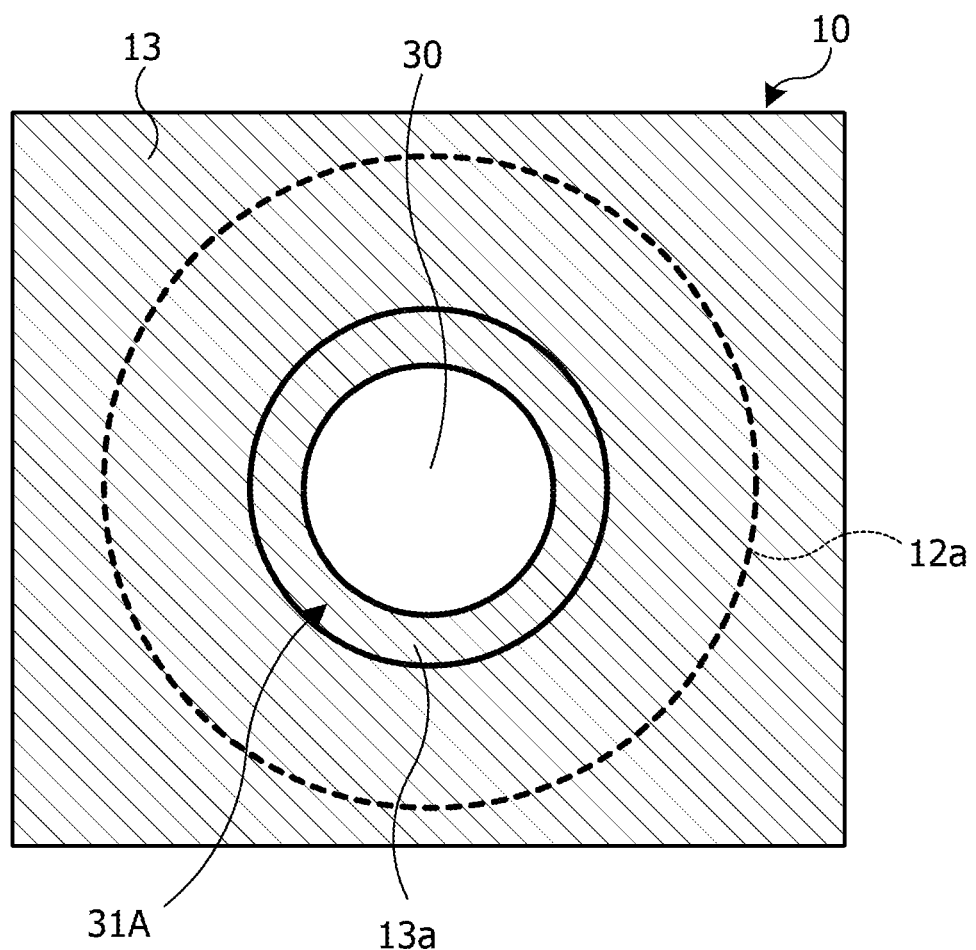

FIGS. 7A to 8B are illustrations of an example of drilling according to the first embodiment. FIG. 7A illustrates schematically a section of a major part of a board before drilling, and FIG. 7B illustrates schematically a plane of a major part of a capacitor before drilling. FIG. 8A illustrates schematically the section of the major part of the board after drilling, and FIG. 8B illustrates schematically the plane of the major part of the capacitor after drilling.

A board 1a depicted in FIG. 7A includes the insulating layer 21, the capacitor 10 provided on the insulating layer 21, and the insulating layer 22 provided on the capacitor 10. In FIG. 7B (and FIG. 8B), the opening part 12a of the electrode layer 12 of the capacitor 10 is indicated by a dotted line. The electrode layer 13 is provided with the recess part 13a at a position corresponding to the opening part 12a of the electrode layer 12, before drilling. In the example of FIGS. 7A and 7B, as the recess part 13a of the electrode layer 13, a recess part 13a having a circular circumferential planar shape in which the whole of an outer edge E (indicated by a chain line) at the position where the hole 30 is formed by drilling is provided. The recess part 13a as depicted in FIGS. 7A and 7B is formed, for example, by half etching of the electrode layer 13, before forming the insulating layer 22 on the capacitor 10, as will be described later.

By subjecting the board 1a as depicted in FIG. 7A to drilling, the hole 30 is formed which penetrates the insulating layer 22, the recess part 13a of the electrode layer 13 of the capacitor 10, the dielectric layer 11, the opening part 12a of the electrode layer 12, and the insulating layer 21 as illustrated in FIG. 8A. As illustrated in FIGS. 8A and 8B, an inner wall of the hole 30 formed is located at a position corresponding to the recess part 13a of the electrode layer 13, on the inner side of an edge of the opening part 12a (indicated by the dotted line) of the electrode layer 12.

In the example of the board 1a illustrated in FIGS. 7A to 8B, the electrode layer 13 is provided with the recess part 13a having a circular circumferential planar shape in which the whole of the outer edge E of the position of drilling is included, whereby the electrode layer 13 is thinned at the outer edge E of the position of drilling. This reduces stress at the time of drilling the electrode layer 13, as compared to the case where the electrode layer 13 not provided with such a recess part 13a is drilled.

While the recess part 13a of the electrode layer 13 here has a circular circumferential planar shape with a projected part 13c left in a central area, such a projected part may not be provided. It is to be noted, however, that when the recess part 13a of the electrode layer 13 is formed by half etching, etching in the plane of the electrode layer 13 may proceed nonuniformly, depending on the material of the electrode layer 13, etching conditions or the like. In this case, if the etching region is wide, the part to be left on the circuit board 1 as the recess part 13a of the electrode layer 13 may be penetrated, and, upon formation of the conductor via 31 in the hole 30 after drilling, the conductor via 31 and the electrode layer 13 may be uncoupled (disconnected), thereby lowering the performance of the circuit board 1.

On the other hand, when the recess part 13a has the circular circumferential planar shape with the projected part 13c left in a central area as in the example of FIGS. 7A to 8B, the etching region is prevented from being widened, and it is easy to control the rate, depth, area and the like of etching. This ensures that the penetration of the part to be left on the circuit board 1 as the recess part 13a of the electrode layer 13, and the resulting uncoupled state between the electrode layer 13 and the conductor via 31, may be prevented from occurring. When the recess part 13a has the circular circumferential planar shape, it is possible to thin the outer edge E of the drilling position of the electrode layer 13 and to reduce stress at the time of drilling the electrode layer 13, while preventing a trouble which might occur due to widening of the etching region of the electrode layer 13.

A penetration part may be included in a part inside the recess part 13a, provided that the stress at the time of drilling the electrode layer 13 may be reduced, and the conductor via 31 and the electrode layer 13 may be electrically coupled without causing disconnection.

Figure 9A:
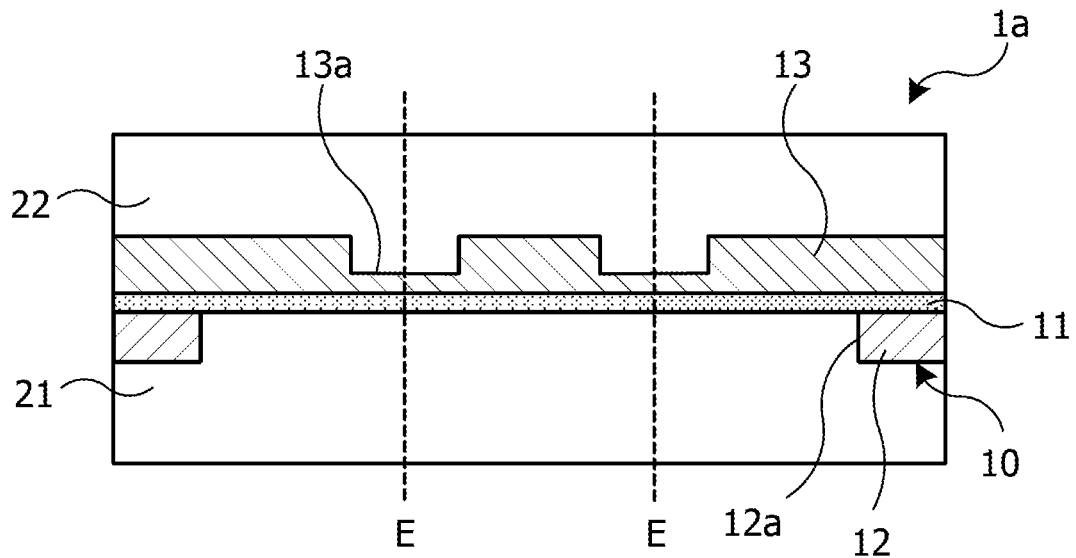
FIGS. 9A and 9B are illustrations of another example of drilling according to the first embodiment.
Figure 9B:
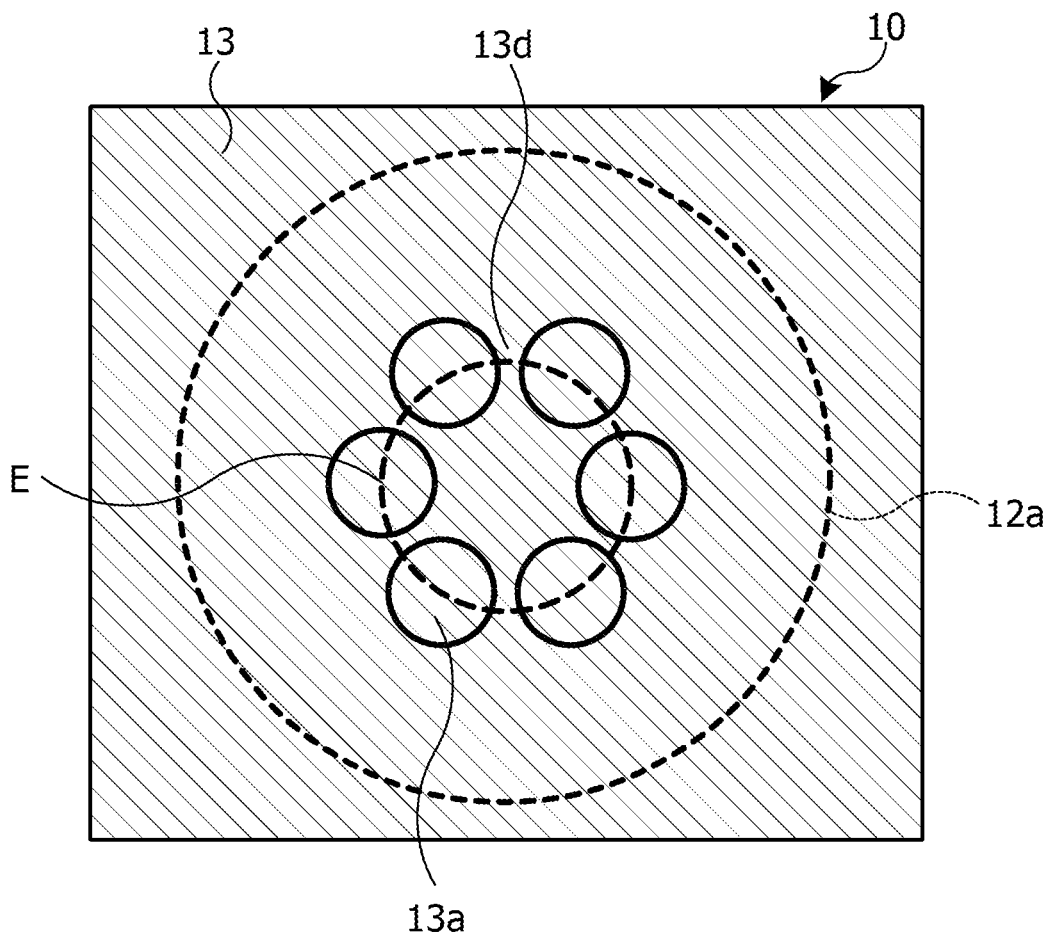
Figure 10A:
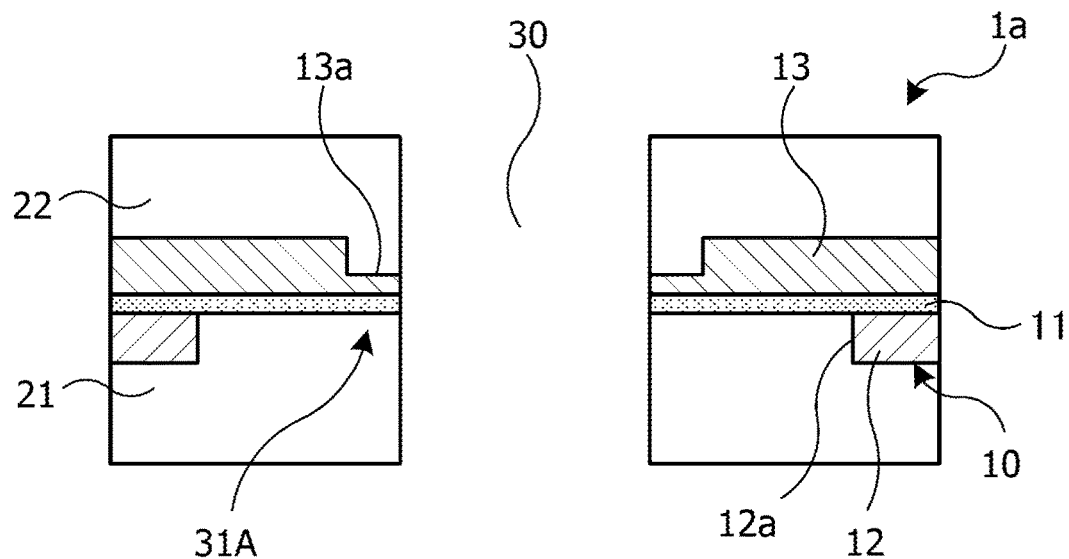
FIGS. 10A and 10B are illustrations of another example of drilling according to the first embodiment.
Figure 10B:
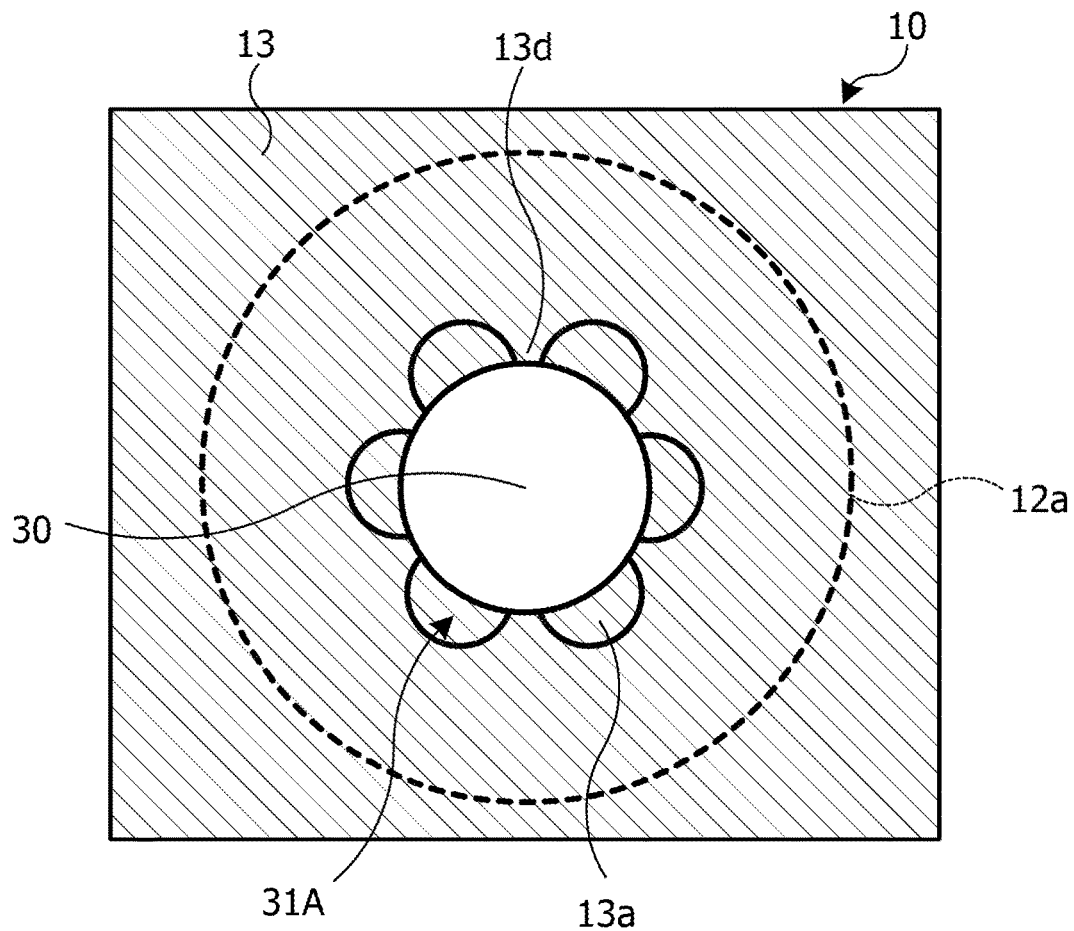

FIGS. 9A to 10B are illustrations of another example of the drilling according to the first embodiment. FIG. 9A illustrates schematically a section of a major part of the board before drilling, and FIG. 9B illustrates schematically a plane of a major part of the capacitor before drilling. FIG. 10A illustrates schematically the section of the major part of the board after drilling, and FIG. 10B illustrates schematically the plane of the major part of the capacitor after drilling.

The board 1a depicted in FIG. 9A also includes the insulating layer 21, the capacitor 10 provided on the insulating layer 21, and the insulating layer 22 provided on the capacitor 10, in the same manner as above. In FIG. 9B (and FIG. 10B), the opening part 12a of the electrode layer 12 of the capacitor 10 is indicated by a dotted line. The electrode layer 13 is provided with the recess part 13a, at a position corresponding to the opening part 12a of the electrode layer 12, before drilling. In the example illustrated in FIGS. 9A and 9B, as the recess part 13a of the electrode layer 13, recess parts 13a having circular planar shapes in which a part of the outer edge E (indicated by the chain line) of the position where to form the hole 30 by drilling are provided in a plurality of (here, as an example, six) locations. The group of recess parts 13a as depicted in FIGS. 9A and 9B are formed, for example, by half etching of the electrode layer 13, before forming the insulating layer 22 on the capacitor 10, as will be described later.

By subjecting the board 1a as depicted in FIG. 9A to drilling, the hole 30 is formed which penetrates the insulating layer 22, the group of recess parts 13a of the electrode layer 13 of the capacitor 10, the dielectric layer 11, the opening part 12a of the electrode layer 12, and the insulating layer 21 as illustrated in FIG. 10A. As illustrated in FIGS. 10A and 10B, an inner wall of the hole 30 formed is located at a position corresponding to the group of recess parts 13a of the electrode layer 13 and parts between the adjacent recess parts 13a (non-thinned parts of the electrode layer 13), on the inner side of an edge of the opening part 12a (indicated by the dotted line) of the electrode layer 12.

In the example of the board 1a illustrate in FIGS. 9A to 10B, the electrode layer 13 is provided with the plurality of recess parts 13a having the circular planar shapes in which a part of the outer edge E of the drilling position is included, whereby the electrode layer 13 is thinned in a plurality of locations of the outer edge E of the drilling position. This reduces the stress at the time of drilling the electrode layer 13, as compared to the case where the electrode layer 13 not provided with such a group of recess parts 13a is drilled.

In the example of FIGS. 9A to 10B, the recess parts 13a are provided in the plurality of locations of the outer edge E of the drilling position, and, therefore, non-thinned parts (unthinned parts) 13d of the electrode layer 13 are left between the adjacent recess parts 13a. For this reason, when the conductor via 31 is formed in the hole 30 formed by drilling, the conductor via 31 is coupled with the unthinned parts 13d which have not been thinned as well as with the thinned recess parts 13a of the electrode layer 13, whereby an increase in electric resistance between the conductor via 31 and the electrode layer 13 may be reduced. When the recess parts 13a are provided in a plurality of locations as in the example of FIGS. 9A to 10B, it is possible to thin the electrode layer 13 in the plurality of locations of the outer edge E of the drilling position and to reduce the stress at the time of drilling the electrode layer 13, while reducing the increase in the electric resistance between the conductor via 31 and the electrode layer 13.

The number and outer size of the recess parts 13a in the group of recess parts 13a as in the example of FIGS. 9A to 10B are not limited to those in the above example. As the total area of the parts of the electrode layer 13 which are thinned due to the group of recess parts 13a is increased, the stress-reducing effect at the time of drilling the electrode layer 13 is increased. On the other hand, as the area of the parts of the electrode layer 13 not thinned due to the group of recess parts 13a is increased, the effect of reducing the electric resistance between the electrode layer 13 and the conductor via 31 formed on the inner wall of the hole 30 is increased.

Part or all of the group of recess parts 13a may be through-holes, or penetration parts may be included in part of the recess parts 13a, provided that the stress at the time of drilling the electrode layer 13 may be reduced and the electrode layer 13 may sufficiently be electrically coupled to the conductor via 31 at its non-thinned parts.

Where the recess part 13a or the group of recess parts 13a are preliminarily provided at a given part or parts of the electrode layer 13 before drilling, as in the board 1a illustrated in FIGS. 7A to 8B or FIGS. 9A to 10B, the stress at the time of drilling the electrode layer 13 is thereby reduced. For this reason, deformation of the electrode layer 130 and the dielectric layer 110 therebeneath due to stress at the time of drilling, generation of a crack 600 between the electrode layer 130 and the dielectric layer 110, and exfoliation 630 upon heating due to such a crack 600, as illustrated in FIGS. 4A to 5C, are reduced. With the generation of a crack or exfoliation between the electrode layer 13 and the dielectric layer 11 in the board 1a reduced, a lowering in the capacitance of the capacitor 10 incorporated may be reduced.

While the recess part 13a circular in outer planar shape is illustrated as an example in FIGS. 7A to 8B and the group of recess parts 13a circular in outer planar shape are depicted as an example in FIGS. 9A to 10B, the outer shape of each recess part 13a is not limited to the circular planar shape. Further, while the FIGS. 7A to 8B and FIGS. 9A to 10B illustrate, as an example, the conductor via 31 and the opening part 12a which are circular in outer planar shape, the outer shapes of the conductor via 31 and the opening part 12a are also not limited to the circular planar shape. The outer shapes of the conductor via 31, each recess part 13a and the opening part 12a may be any of various planar shapes, provided that the conductor via 31 formed on the inner wall of the hole 30 makes contact with the recess part 13a or the group of recess parts 13a and does not make contact with the opening part 12a.

As the recess part 13a or the group of recess parts 13a provided in the electrode layer 13 become deeper or become wider in area or total area, the effect of reducing the stress at the time of drilling becomes higher and, on the other hand, the area of contact between the electrode layer 13 and the conductor via 31 formed in the hole 30 after drilling becomes smaller. For example, the depth and the area of the recess part 13a or the group of recess parts 13a provided in the electrode layer 13 are set, taking into account the stress at the time of drilling the electrode layer 13 provided with the recess part 13a or the group of recess parts 13a, and the electric resistance between the electrode layer 13 provided with the recess part 13a or the group of recess parts 13a and the conductor via 31.

An example of a method of forming the circuit board 1 configured as above will now be described. FIGS. 11A to 12C are figures illustrating an example of the method of forming the circuit board according to the first embodiment. FIGS. 11A to 11C and FIGS. 12A to 12C each illustrate schematically a section of a major part in each process of forming the circuit board according to the first embodiment.

Figure 11A:
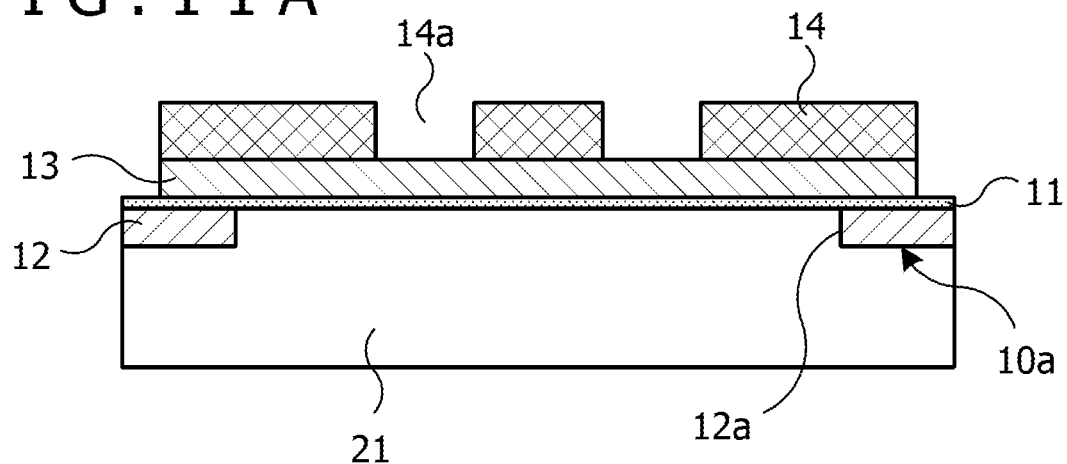
FIGS. 11A, 11B, and 11C are figures illustrating an example of a method of forming the circuit board according to the first embodiment.

In this example, a laminate of the insulating layer 21 and the capacitor board 10a as depicted in FIG. 11A is prepared, according to the example of FIGS. 1A to 1C and FIGS. 2A to 2C. The capacitor board 10a is obtained, for example, by a process in which the dielectric layer 11 containing BTO as a main constituent is sinteredly formed on the electrode layer 13 on one side containing Ni as a main constituent, and the electrode layer 12 on the other side containing Cu as a main constituent is coveringly formed thereon. The capacitor board 10a has the electrode layer 12 on one side patterned, and is united with the insulating layer 21 using a resin or the like, and, further, the electrode layer 13 on another side is patterned. On the electrode layer 13 of the capacitor board 10a of such a laminate, a resist pattern 14 including an opening part or parts 14a in a region or regions for forming the recess part 13a or the recess parts 13a is formed, as depicted in FIG. 11A.

Figure 11B:
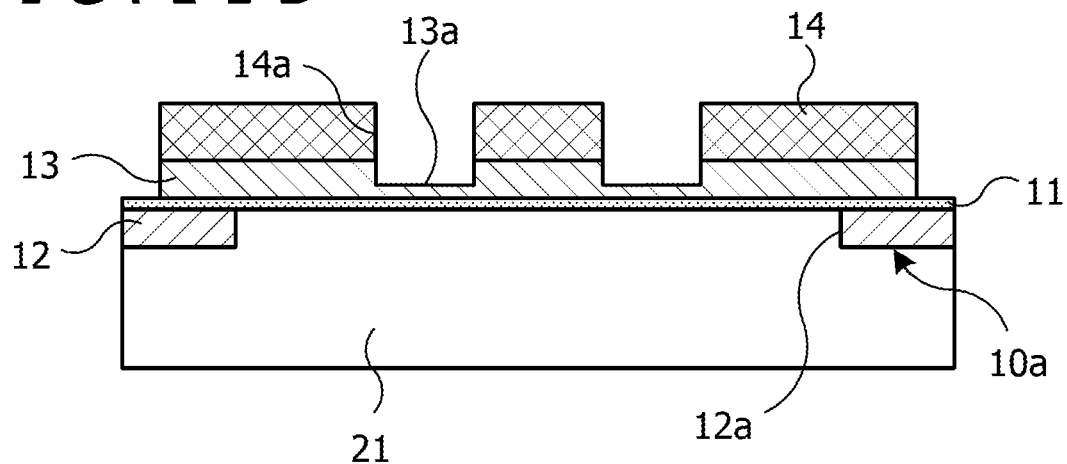

After the formation of the resist pattern 14, half etching of the electrode layer 13 is carried out with the resist pattern 14 as a mask, as depicted in FIG. 11B. By the half etching of the electrode layer 13, the recess part 13a or the group of recess parts 13a are formed in a region in which the whole or a part of the outer edge of the drilling position, at the time of forming the hole 30 by drilling as will be described later, is included. For example, a recess part 13a as depicted as an example in FIGS. 7A and 7B or a group of recess parts 13a as depicted as an example in FIGS. 9A and 9B are formed by the half etching of the electrode layer 13 using the resist pattern 14.

The half etching of the electrode layer 13 may be performed by wet etching. At the time of etching, various conditions (the kind, temperature and concentration of an etching solution, treating time, etc.) are controlled. With the various conditions of etching controlled, the recess part 13a or the group of recess parts 13a in a given depth are formed in the electrode layer 13. For example, by half etching of the electrode layer 13 having a thickness of 30 μm, the recess part 13a or the group of recess parts 13a having a depth of 20 μm are formed. In this case, the electrode layer 13 in a thickness of 10 μm is left under the recess part 13a.

Figure 11C:
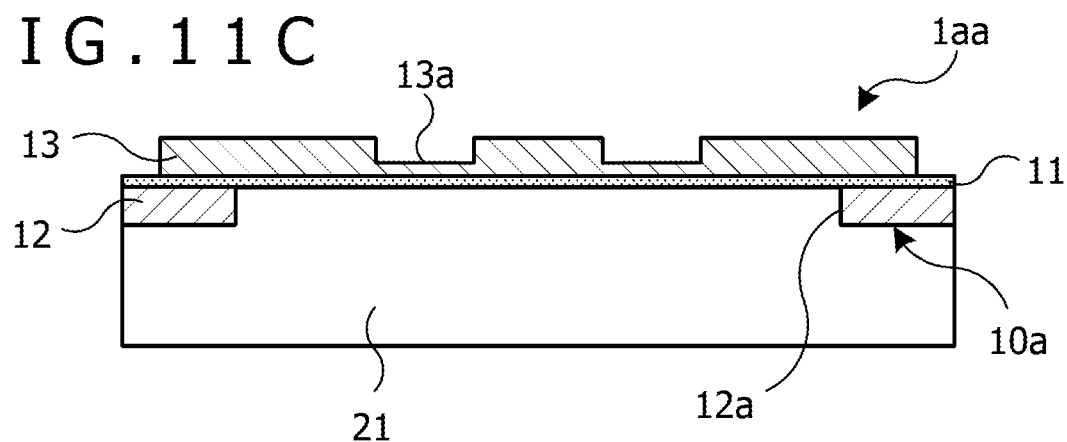

After the half etching, the resist pattern 14 is removed, as depicted in FIG. 11C. This results in that a laminate 1aa in which a capacitor board 10a including the electrode layer 12 including the opening part 12a, the dielectric layer 11, and the electrode layer 13 including the recess part 13a or the group of recess parts 13a in a region or regions corresponding to the opening part 12a is provided on the insulating layer 21 is obtained.

Figure 12A:
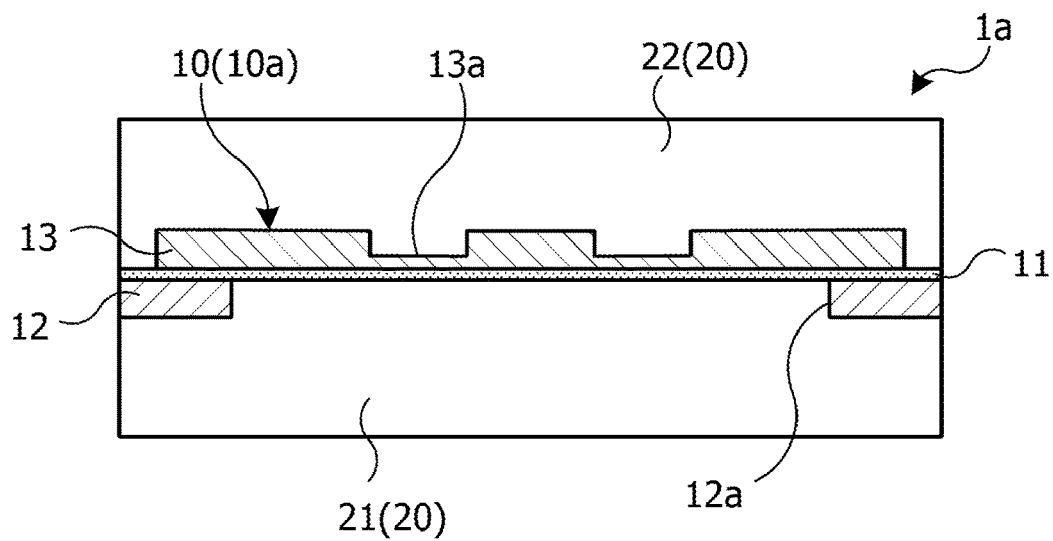
FIGS. 12A, 12B, and 12C are figures illustrating an example of the method of forming the circuit board according to the first embodiment.

On the laminate 1aa obtained, the insulating layer 22 using a resin or the like is formed, as depicted in FIG. 12A. The insulating layer 22 is, for example, thermocompression bonded onto the capacitor board 10a provided on the insulating layer 21, whereby the insulating layer 22 is united with the insulating layer 21 and the capacitor board 10a.

For example, the method as illustrated in FIGS. 11A to 11C and 12A is used to form a board 1a incorporating the capacitor 10 (capacitor board 10a) in the insulating layer 21 and the insulating layer 22 (the insulating layer 20).

Figure 12B:
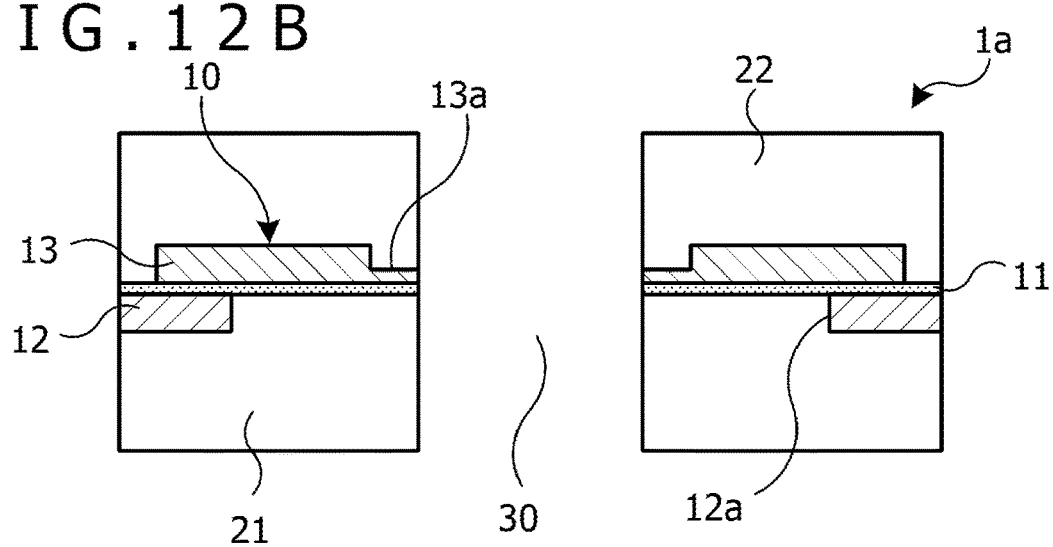

After the formation of the board 1a as depicted in FIG. 12A, the hole 30 penetrating the insulating layer 22, the capacitor 10 and the insulating layer 21 is formed, as illustrated in FIG. 12B. The hole 30 is formed by drilling. The hole 30 is formed at the position of the opening part 12a provided in the electrode layer 12 of the capacitor 10 and the recess part 13a or the group of recess parts 13a provided in the electrode layer 13. For example, the hole 30 is formed by drilling, as illustrated as an example in FIGS. 8A and 8B, or as depicted as an example in FIGS. 10A and 10B.

The electrode layer 13 on one side of the capacitor 10 has been formed, before drilling, with the recess part 13a or the group of recess parts 13a, in a region which corresponds to the opening part 12a and in which the whole or a part of the outer edge of the drilling position is included. The electrode layer 12 on another side of the capacitor 10 has been formed, before drilling, with the opening part 12a in an opening size larger than the outer edge of the drilling position.

Since the electrode layer 13 on one side is formed with the recess part 13a or the group of recess parts 13a at the drilling position, it is ensured that, when the hole 30 penetrating the capacitor 10 is formed by drilling, the stress at the time of drilling the electrode layer 13 is reduced as compared to the case where the recess part 13a or the group of recess parts 13a are not formed. The electrode layer 12 on another side is not cut by drilling, since the drill penetrates the opening part 12a. Since the stress at the time of drilling is reduced by the presence of the recess part 13a or the group of recess parts 13, deformation of the electrode layer 130 and the dielectric layer 110 therebeneath and the generation of a crack 600 between the electrode layer 130 and the dielectric layer 110, as illustrated in FIGS. 4A to 5C, are prevented.

Figure 12C:
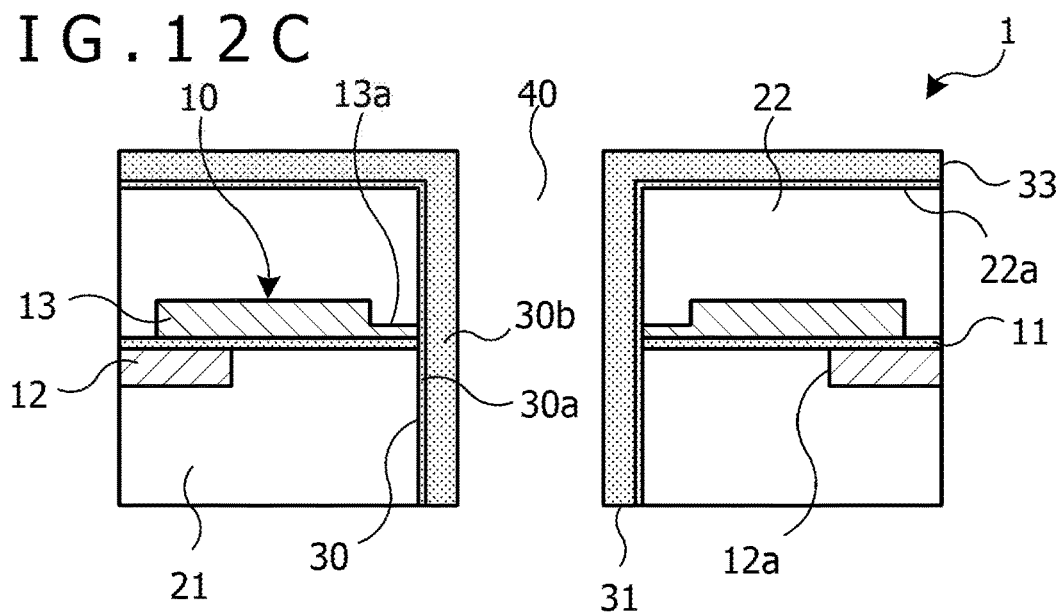

After the formation of the hole 30, a conductor material such as Cu is formed on the inner wall of the hole 30, whereby the conductor via 31 is formed, as illustrated in FIG. 12C. For example, a conductor layer (seed layer) 30a is first formed by electroless plating, and then a conductor layer (plating layer) 30b is formed by electroplating in which the seed layer 30a is used as a current supply layer. This results in that the conductor via 31 is formed on the inner wall of the hole 30. The conductor via 31 is in contact with the dielectric layer 11 exposed at the inner wall of the hole 30 formed by drilling and the recess part 13a or the group of recess parts 13a of the electrode layer 13, out of the dielectric layer 11 and the electrode layer 12 and the electrode layer 13 of the capacitor 10, and is electrically coupled to the electrode layer 13.

At the time of formation of the conductor via 31, the seed layer 30a and the plating layer 30b are formed on the upper surface 22a of the insulating layer 22 in addition to on the inner wall of the hole 30, as illustrated in FIG. 12C. This enables the formation of the conductor layer 33 on the upper surface 22a of the insulating layer 22. The conductor layer 33 may be patterned into a given shape.

The conductor via 31 is formed on the inner wall of the hole 30, and is formed as a conformal via in which the cavity 40 is left in a central area. In this case, the cavity 40 may be filled with a resin (not illustrated) such as epoxy resin. The hole 30 may be filled with a conductor material, to form a filled via.

Figure 13A:
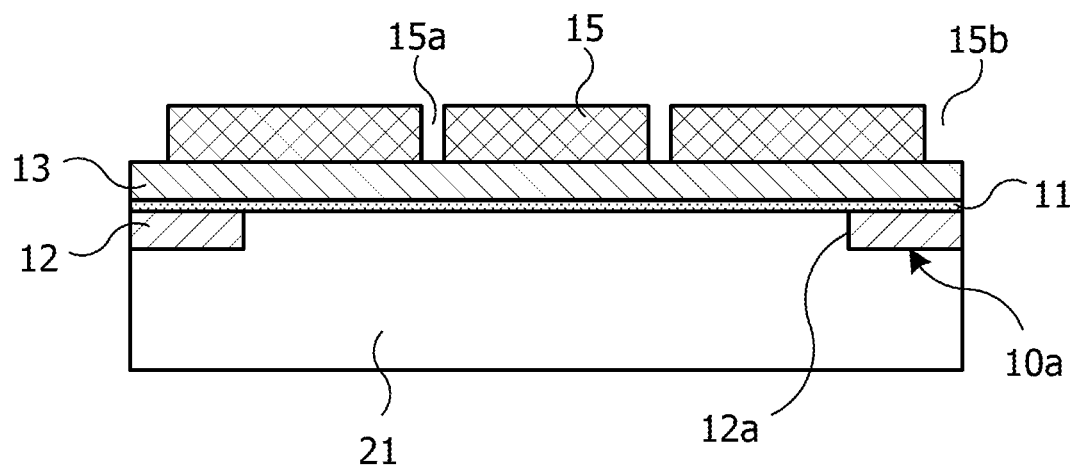
FIGS. 13A, 13B, and 13C are figures illustrating another example of the method of forming the circuit board according to the first embodiment.
Figure 13B:
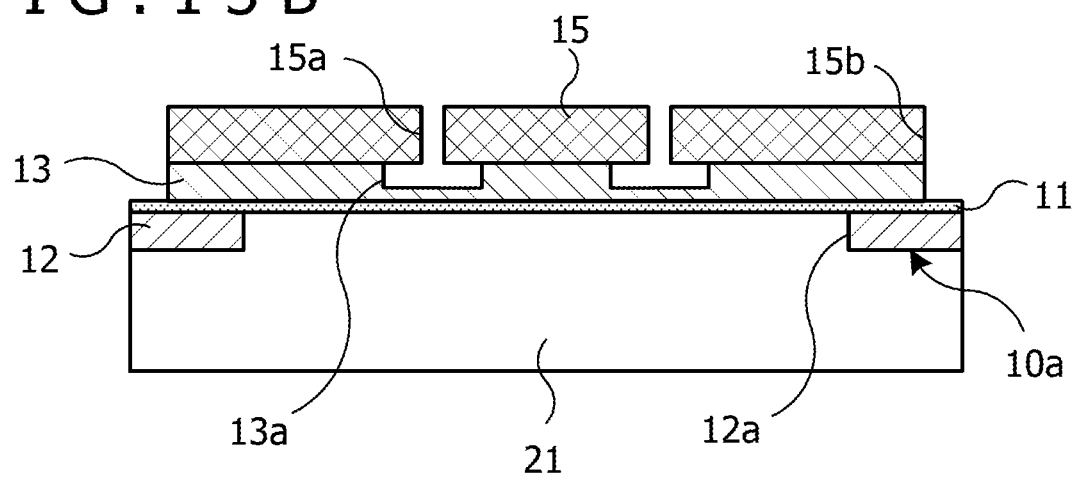
Figure 13C:
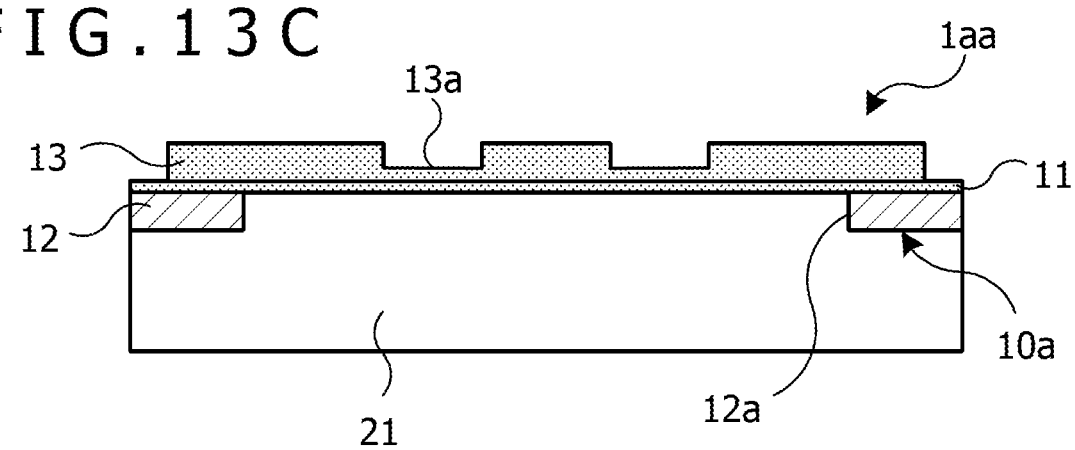

The circuit board 1 is formed, for example, by use of the method as described above. The circuit board 1 may also be formed by use of a method as follows. FIGS. 13A to 13C are figures illustrating another example of the method of forming the circuit board according to the first embodiment. FIGS. 13A to 13C each illustrate schematically a section of a major part in each process of forming the circuit board according to the first embodiment.

In this example, a laminate of the insulating layer 21 and the capacitor board 10a as depicted in FIG. 13A is prepared, according to the example of FIGS. 1A to 1C. The capacitor board 10a includes the dielectric layer 11, the patterned electrode layer 12, and the electrode layer 13 yet to be patterned, and is united with the insulating layer 21 using a resin or the like. On the electrode layer 13 of the capacitor board 10a of such a laminate, a resist pattern 15 for patterning the electrode layer 13 is formed, as illustrated in FIG. 13A.

The resist pattern 15 includes an opening part 15b provided in a region for removal of the electrode layer 13, and an opening part or parts 15a communicating with a region or regions for formation of the recess part 13a or the group of recess parts 13a. Of the opening part 15b and the opening part or parts 15a of the resist pattern 15, the opening part or parts 15a communicating with the region or regions for formation of the recess part 13a or the group of recess parts 13a is or are comparatively fine opening or openings having an opening size of not larger than the thickness of the electrode layer 13.

After the formation of the resist pattern 15, etching of the electrode layer 13 is conducted using the resist pattern 15 as a mask, as depicted in FIG. 13B. The etching of the electrode layer 13 may be carried out by wet etching. At the time of etching, various conditions (the kind, temperature and concentration of an etching solution, treating time, etc.) are controlled.

By the etching of the electrode layer 13 using the resist pattern 15 as a mask, the electrode layer 13 at the opening part 15b is removed, and the electrode layer 13 is patterned into a given planar shape. At the time of this etching, etching of the region or regions for formation of the recess part 13a or the group of recess parts 13a of the electrode layer 13 also proceeds, through the opening part or parts 15a formed as comparatively fine opening or openings. Since the opening part or parts 15a are formed as comparatively fine opening or openings, the etching through the opening part or parts 15a proceeds at a lower etching rate of the electrode layer 13, as compared to that at the opening part 15b larger in opening size. The opening size of the opening part or parts 15a and various conditions of etching (etching solution treatment time, etc.) are controlled, whereby the recess part 13a or the group of recess parts 13a having a given depth are formed in the electrode layer 13.

After the etching, the resist pattern 15 is removed, as depicted in FIG. 13C. This results in that the laminate 1aa in which the capacitor board 10a including the electrode layer 12 including the opening part 12a, the dielectric layer 11, and the electrode layer 13 including the recess part 13a or the group of recess parts 13a is provided on the insulating layer 21.

By use of the method as illustrated in FIGS. 13A to 13C, the patterning of the electrode layer 13 into a given planar shape and the formation of the recess part 13a or the group of recess parts 13a may be performed simultaneously.

Thereafter, in the same manner as FIGS. 12A to 12C, the insulating layer 22 is formed on the laminate 1aa to form the board 1a (FIG. 12A), the hole 30 is formed by drilling (FIG. 12B), and the conductor via 31 and the conductor layer 33 are formed by a plating method (FIG. 12C).

The circuit board 1 may also be formed by the method as described above. In the examples of FIGS. 11A to 11C and FIGS. 13A to 13C, the formation of the recess part 13a or the group of recess parts 13a has been applied to the electrode layer 13 of the capacitor board 10a having been united with the insulating layer 21. The formation of the recess part 13a or the group of recess parts 13a in the electrode layer 13 may also be applied to the electrode layer 13 of the capacitor board 10a yet to be united with the insulating layer 21, according to the examples of FIGS. 11A to 11C and FIGS. 13A to 13C. In this case, the capacitor board 10a with the electrode layer 12 and the electrode layer 13 having both been patterned is united with the insulating layer 21, and the processes as depicted in FIGS. 12A to 12C are performed.

In the circuit board 1, before drilling for forming the hole 30, the electrode layer 13 is provided with the recess part 13a or the group of recess parts 13a at a position or positions corresponding to the outer edge of the drilling position. For this reason, stress at the time of drilling the electrode layer 13 is reduced, deformation of the electrode layer 13 and the dielectric layer 11 therebeneath is reduced, and generation of a crack between the electrode layer 13 and the dielectric layer 11 is prevented. Since the generation of a crack between the electrode layer 13 and the dielectric layer 11 is prevented in the circuit board 1, penetration of a plating solution into such a crack, at the time of forming the conductor via 31 in the hole 30 by a plating method, is prevented. Since generation of a crack and penetration of the plating solution into such a crack are prevented, it is ensured that even when the circuit board 1 is heated at the time of a test or practical use, expansion of the plating solution in the crack and exfoliation between the dielectric layer 11 and the electrode layer 12 and the electrode layer 13 are prevented from being generated. As a result, a lowering in the capacitance of the capacitor 10 incorporated in the circuit board 1 is prevented.

According to the above-described technique, a circuit board 1 excellent in reliability and performance is realized in which it is possible to effectively prevent generation of a crack at the time of drilling, exfoliation at the time of a test or practical use involving heating, and the resulting lowering in capacitance, in the capacitor 10.

While the capacitor 10 or the capacitor board 10a here has a configuration in which the electrode layer 12 is disposed directed to the insulating layer 21 side and the electrode layer 13 is disposed directed to the insulating layer 22 side, it is natural that a configuration may be adopted in which the electrode layer 13 is disposed directed to the insulating layer 21 side and the electrode layer 12 is disposed directed to the insulating layer 22 side.

In this case, the electrode layer 13 located on the lower layer side is formed with an opening part larger than the outer edge of the drilling position, and the electrode layer 12 located on the upper layer side is formed with a recess part or a group of recess parts in a region which corresponds to the opening part of the electrode layer 13 and in which the whole or a part of the outer edge of the drilling position is included.

While an example in which the electrode layer 13 of the capacitor 10 is provided with the recess part 13a or the group of recess parts 13a has been described here, the electrode layer 12 may also be provided with the recess part or the group of recess parts, like the electrode layer 13.

In this case, for example, the electrode layer 12 of the capacitor board 10a (FIG. 1A) yet to be united with the insulating layer 21 is formed with the recess part or the group of recess parts in a given region (a region which corresponds to the opening part of the electrode layer 13 and in which the whole or a part of the outer edge of the drilling position is included). The formation of the recess part or the group of recess parts in the electrode layer 12 of the capacitor board 10a may be performed according to the example of the method illustrated in FIGS. 11A to 11C or FIGS. 13A to 13C.

The capacitor board 10a is united with the insulating layer 21, and the electrode layer 13 is formed with the recess part 13a or the group of recess parts 13a in a given region (a region which corresponds to the opening part 12a of the electrode layer 12 and in which the whole or a part of the outer edge of the drilling position is included). The formation of the recess part 13a or the group of recess parts 13a in the electrode layer 13 may be applied to the electrode layer 13 of the capacitor board 10a yet to be united with the insulating layer 21. The formation of the recess part 13a or the group of recess parts 13a in the electrode layer 13 may be conducted according to the example of the method illustrated in FIGS. 11A to 11C or FIGS. 13A to 13C.

In this way, the laminate is obtained in which the recess part or the group of recess parts are provided in each given region of both of the electrode layer 12 and the electrode layer 13. Thereafter, in the same manner as FIGS. 12A to 12C, formation of an insulating layer (FIG. 12A), formation of a hole by drilling (FIG. 12B), and formation of a conductor via and a conductor layer by a plating method (FIG. 12C) are performed. The recess part or the group of recess parts provided in each of the electrode layer 12 and the electrode layer 13 before drilling reduces both the stress at the time of drilling of the opening part of the electrode layer 13, the dielectric layer 11 and the electrode layer 12 and the stress at the time of drilling of the opening part of the electrode layer 12, the dielectric layer 11 and the electrode layer 13.

While illustration is omitted here, a build-up process of laminating an insulating layer of a resin or the like on the circuit board 1 formed as above-mentioned and forming the insulating layer with a conductor via and a conductor layer may be conducted once or repeated multiple times, to obtain a circuit board including a desired number of wiring layers.

Now, a second embodiment will be described. FIG. 14 is a figure illustrating an example of a circuit board according to the second embodiment. FIG. 14 illustrates schematically a section of a major part in the example of the circuit board according to the second embodiment.

A circuit board 1A depicted in FIG. 14 includes a base board 24 including a wiring 24a, the insulating layer 21 provided on the base board 24, the capacitor 10 provided on the insulating layer 21, and the insulating layer 22 provided on the capacitor 10. A plurality of (here, as an example, three) holes 30 are provided in such a manner as to penetrate the insulating layer 22, the capacitor 10, the insulating layer 21 and the base board 24. On an inner wall of each hole 30, the conductor via 31 in a conformal via shape is provided.

The electrode layer 12 of the capacitor 10 is formed with the recess part 12b or the group of recess parts 12b or with the opening part 12a, at the position where to provide the conductor via 31. The electrode layer 13 of the capacitor 10 is provided with the opening part 13b or with the recess part 13a or the group of recess parts 13a, at the position where to provide the conductor via 31.

One (conductor via 31a) of the conductor vias 31 penetrates the opening part 12a of the electrode layer 12, the dielectric layer 11, and the opening part 13b of the electrode layer 13, and is not electrically coupled to the capacitor 10. Another (conductor via 31b) of the conductor vias 31 penetrates the opening part 13b of the electrode layer 13, the dielectric layer 11, and the recess part 12b or the group of recess parts 12b of the electrode layer 12, with the recess part 12b or the group of recess parts 12b located at an outer peripheral part 31A thereof, and is electrically coupled to the electrode layer 12 of the capacitor 10. A further one (conductor via 31c) of the conductor vias 31 penetrates the recess part 13a or the group of recess parts 13a of the electrode layer 13, the dielectric layer 11, and the opening part 12a of the electrode layer 12, with the recess part 13a or the group of recess parts 13b located at an outer peripheral part 31A thereof, and is electrically coupled to the electrode layer 13 of the capacitor 10.

The inside of the conductor via 31 is filled with a resin 41. Conductor layers 36 are provided on the upper and lower sides of the conductor via 31 filled with the resin 41. The conductor layers 36 are formed, for example, by use of a plating method (so-called lid-plating). For example, the conductor layer 33 provided on the insulating layer 22 and the conductor layer 33 provided beneath the base board 24 are respectively patterned into given shapes together with the conductor layers 36, after the formation of the conductor layers 36.

Build-up layers 2a are respectively provided on the insulating layer 22 and beneath the base board 24. The build-up layers 2a each include the insulating layer 23, the coupling via 35 provided in the hole 35a penetrating the insulating layer 23 and reaching the conductor layer 36 on the conductor via 31, and a conductor layer 37 provided on the coupling via 35. For example, the conductor layer 37 is used as a terminal for external coupling of the circuit board 1A.

FIG. 14 illustrate, as an example, three conductor vias 31, for example, a conductor via 31a which is not electrically coupled to the capacitor 10, and a conductor via 31b and a conductor via 31c which are electrically coupled to the capacitor 10. In the circuit board 1A, the conductor layer 37 (terminal 37a) which is electrically coupled to the conductor via 31a is used as a signal terminal. Of the conductor layer 37 (terminal 37b) electrically coupled to the conductor via 31b and the conductor layer 37 (terminal 37c) electrically coupled to the conductor via 31c, one is used as a power supply terminal and the other is used as a GND terminal. This results in that, of the electrode layer 12 electrically coupled to the conductor via 31b and the electrode layer 13 electrically coupled to the conductor via 31c, of the capacitor 10, one is set to a power supply potential and the other is set to a GND potential.

By adopting the technology described in the first embodiment, a circuit board 1A as illustrated in FIG. 14 is obtained, for example. At the time of forming the circuit board 1A, the electrode layer 12 yet to be drilled is preliminarily provided with the recess part 12b or the group of recess parts 12b correspondingly to the opening part 13b of the electrode layer 13, whereby the stress at the time of drilling the electrode layer 12 is reduced. Similarly, at the time of forming the circuit board 1A, the electrode layer 13 yet to be drilled is preliminarily provided with the recess part 13a or the group of recess parts 13a correspondingly to the opening part 12a of the electrode layer 12, whereby the stress at the time of drilling the electrode layer 13 is reduced. This realizes a circuit board 1A excellent in reliability and performance, in which it is possible to effectively prevent generation of a crack at the time of drilling, exfoliation upon heating due to such a crack, and the resulting lowering in capacitance, in the capacitor 10.

While a circuit board 1A in which a single build-up layer 2a each is provided on the insulating layer 22 side and on the base board 24 side has been described here as an example, the number of the build-up layer or layers 2a is not limited to this. The conductor vias 31 (31a, 31b, 31c) may be configured as filled vias.

Now, a third embodiment will be described. A variety of electronic parts, for example, semiconductor devices such as semiconductor chips and/or semiconductor packages may be mounted on the circuit boards 1, 1A and the like as described in the first and second embodiments.

Figure 15:
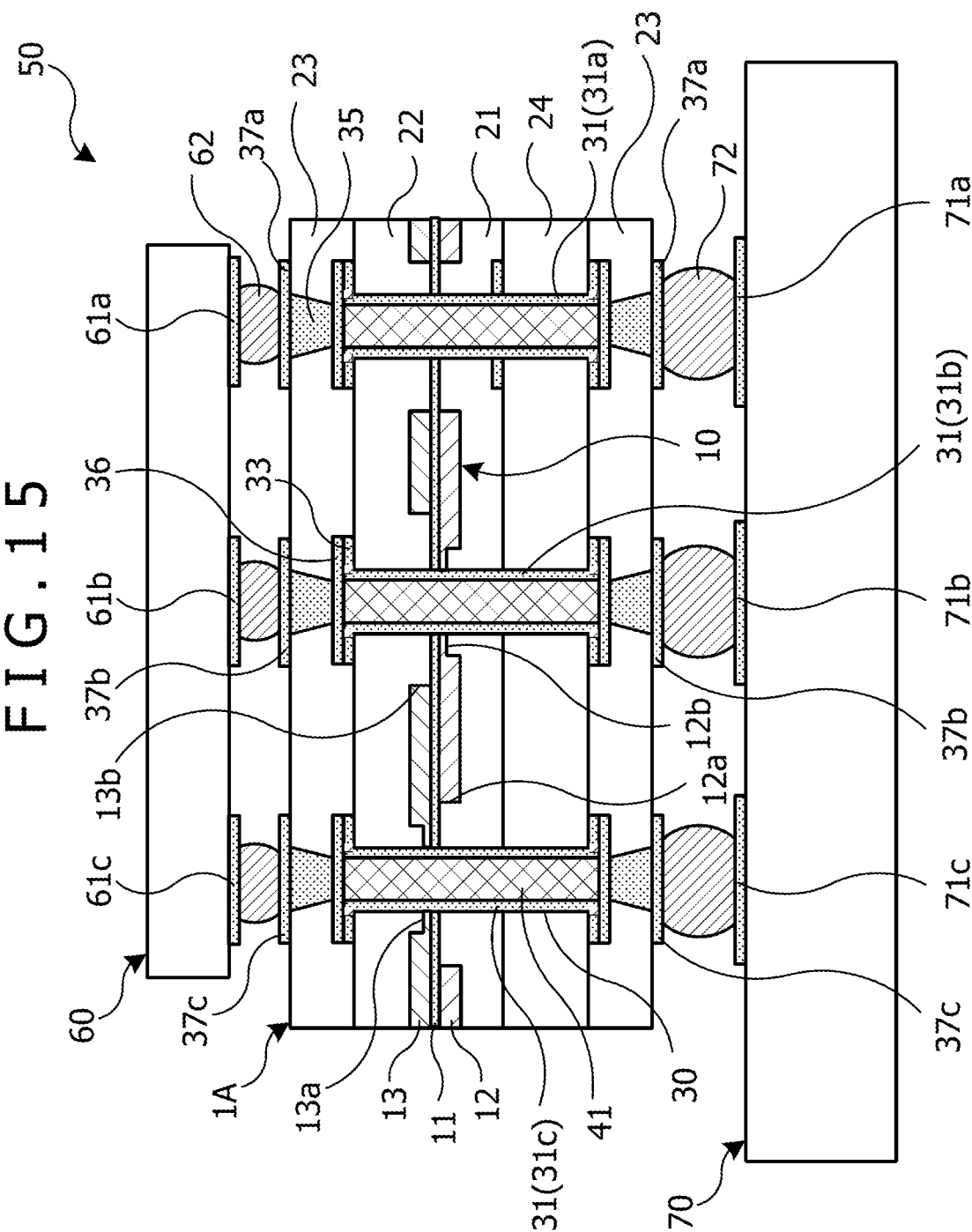
FIG. 15 is a figure illustrating an example of an electronic device according to a third embodiment.

FIG. 15 is a figure illustrating an example of an electronic device according to the third embodiment. FIG. 15 uses the same reference signs including numerals in FIG. 14. FIG. 15 illustrates schematically a section of a major part in the example of the electronic device according to the third embodiment. The circuit board 1A described in the second embodiment is taken here as an example. An electronic device 50 depicted in FIG. 15 includes the circuit board 1A, and an electronic part 60 mounted on the circuit board 1A. The electronic device 50 includes a configuration in which the circuit board 1A with the electronic part 60 mounted thereon is mounted on a circuit board 70.

The electronic part 60 is, for example, a semiconductor chip, or a semiconductor package which includes a semiconductor chip. Such an electronic part 60 is mounted on the circuit board 1A. The terminal 37a, the terminal 37b and the terminal 37c provided on the side of that surface of the circuit board 1A on which to mount the electronic part 60 and a terminal 61a, a terminal 61b and a terminal 61c provided in the electronic part 60 are bonded through bumps 62 using a solder or the like. This realizes electrical coupling between the electronic part 60 and the circuit board 1A. The terminal 61a of the electronic part 60 is a signal terminal. Of the terminal 61b and the terminal 61c of the electronic part 60, for example, the terminal 61b is a power supply terminal and the terminal 61c is a GND terminal.

The circuit board 1A on which the electronic part 60 is thus mounted is further mounted on the circuit board 70. The circuit board 70 is, for example, a printed circuit board. The terminal 37a, the terminal 37b and the terminal 37c which are provided on the circuit board 70 side of the circuit board 1A and a terminal 71a, a terminal 71b and a terminal 71c which are provided on the circuit board 70 are bonded through bumps 72 using a solder or the like. This results in that the circuit board 1A with the electronic part 60 mounted thereon and the circuit board 70 are electrically coupled. The terminal 71a of the circuit board 70 is a signal terminal. Of the terminal 71b and the terminal 71c of the circuit board 70, for example, the terminal 71b is a power supply terminal and the terminal 71c is a GND terminal.

In the electronic device 50, power is supplied from the circuit board 70 to the electronic part 60 through the bumps 72, the circuit board 1A and the bumps 62. The capacitor 10 is provided on a power supply line from the circuit board 70 to the electronic part 60. In this example, the electrode layer 12 of the capacitor 10 is set to a power supply potential, and the electrode layer 13 is set to a GND potential. With the capacitor 10 provided on the power supply line, a reduction in power supply impedance, variations in power supply voltage, and generation of high-frequency noises are reduced, and a stable operation of the electronic part 60 is realized.

In the circuit board 1A, the recess part 12b or the group of recess parts 12b are provided at the drilling position or positions of the electrode layer 12 of the capacitor 10, and the recess part 13a or the group of recess parts 13a are provided at the drilling position or positions of the electrode layer 13. This realizes a circuit board 1A excellent in reliability and performance, in which it is possible to reduce the stress at the time of drilling the capacitor 10 and to effectively prevent generation of a crack, exfoliation at the time of a test or practical use involving heating, and the resulting lowering in capacitance, in the capacitor 10. The use of such a circuit board 1A realizes an electronic device 50 excellent in reliability and performance against heating.

The electronic device 50 may be further mounted on any of various electronic apparatuses (also called electronic devices). For example, the electronic device 50 may be mounted on various electronic apparatuses such as computers (personal computers, supercomputers, servers, etc.), smartphones, mobile phones, tablet terminals, sensors, cameras, audio apparatuses, measuring instruments, inspection devices, and manufacturing equipment.

FIG. 16 is a figure illustrating an example of an electronic apparatus according to the third embodiment. FIG. 16 uses the same reference signs including numerals in FIGS. 14 and 15. FIG. 16 illustrates schematically the example of the electronic apparatus. As illustrated in FIG. 16, the electronic device 50 as above is mounted (incorporated) on (in) an electronic apparatus 80. In the circuit board 1A used for the electronic device 50, it is possible to effectively prevent generation of a crack at the time of drilling, exfoliation at the time of a test or practical use involving heating, and the resulting lowering in capacitance, in the capacitor 10. This realizes an electronic device 50 excellent in reliability and performance against heating, and realizes an electronic apparatus 80 on which such an electronic device 50 is mounted and which is excellent in reliability and performance.

The foregoing merely describes examples. A multiplicity of further modifications and changes are possible by a person skilled in the art, the present technology is not to be limited to the accurate configurations and application examples described above, and all the corresponding modifications and the equivalence thereof are in the scope of the present technology defined by claims and the equivalence thereof.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A circuit board comprising:
an insulating layer;
a capacitor which is provided in the insulating layer and which includes a dielectric layer, a first conductor layer provided on a first surface of the dielectric layer and including an opening part, and a second conductor layer provided on a second surface opposite to the first surface of the dielectric layer, the second conductor layer having a first thickness and a second thickness in a laminating direction, the second thickness being thinner than the first thickness, with a portion of the second conductor layer having the second thickness being a recess part disposed at a position corresponding to the opening part; and
a conductor via provided in the insulating layer, penetrating the dielectric layer, the opening part and the recess part, the conductor via being in contact with the recess part and being smaller than the opening part of the first conductor layer in a plan view.

2. The circuit board according to claim 1, wherein the recess part is provided at an outer peripheral part of the conductor via in the plan view.

3. The circuit board according to claim 2, wherein the recess part is provided continuously along an outer edge of the conductor via.

4. The circuit board according to claim 2, wherein the recess part is provided on a part of the outer peripheral part.

5. The circuit board according to claim 2, wherein the recess part is provided in a plurality of locations on the outer peripheral part.

6. The circuit board according to claim 1, wherein the conductor via is in contact with the dielectric layer.

7. The circuit board according to claim 1, wherein, of the first conductor layer and the second conductor layer, one contains copper, and the other contains nickel.

8. An electronic device comprising:
a circuit board including
an insulating layer,
a capacitor which is provided in the insulating layer and which includes a dielectric layer, a first conductor layer provided on a first surface of the dielectric layer and including an opening part, and a second conductor layer provided on a second surface opposite to the first surface of the dielectric layer, the second conductor layer having a first thickness and a second thickness in a laminating direction, the second thickness being thinner than the first thickness, with a portion of the second conductor layer having the second thickness being a recess part disposed at a position corresponding to the opening part, and
a conductor via provided in the insulating layer, penetrating the dielectric layer, the opening part and the recess part, the conductor via being in contact with the recess part and being smaller than the opening part of the first conductor layer in a plan view; and
an electronic part mounted on the circuit board, the electronic part including a circuit.

* * * * *